US009329613B2

(12) United States Patent
Ting

(10) Patent No.: US 9,329,613 B2
(45) Date of Patent: May 3, 2016

(54) POWER EFFICIENCY IMPROVEMENT OF AN AUDIO AMPLIFIER BY ADAPTIVE CONTROL OF A CHARGE PUMP

(71) Applicant: Richtek Technology Corporation, Chupei, Hsinchu (TW)

(72) Inventor: Chia-Din Ting, Taipei (TW)

(73) Assignee: RICHTEK TECHNOLOGY CORP., Hsinchu (TW)

( * ) Notice: Subject to any disclaimer, the term of this patent is extended or adjusted under 35 U.S.C. 154(b) by 571 days.

(21) Appl. No.: 13/733,595

(22) Filed: Jan. 3, 2013

(65) Prior Publication Data

US 2013/0177175 A1    Jul. 11, 2013

(30) Foreign Application Priority Data

Jan. 6, 2012  (TW) .............................. 101100634 A

(51) Int. Cl.
 *G05F 3/02* (2006.01)
 *H03G 3/20* (2006.01)
 *H03G 1/00* (2006.01)

(52) U.S. Cl.
 CPC ................ *G05F 3/02* (2013.01); *H03G 1/0094* (2013.01); *H03G 3/20* (2013.01)

(58) Field of Classification Search
 CPC ........................................................ G05F 3/02

USPC ............................ 381/120; 327/536; 330/297
See application file for complete search history.

(56) References Cited

U.S. PATENT DOCUMENTS

| 7,701,294 | B1 | 4/2010 | Yun |
| 7,714,660 | B2 | 5/2010 | Lesso et al. |
| 2008/0197907 | A1 | 8/2008 | Wang |
| 2010/0181982 | A1 | 7/2010 | Chen et al. |
| 2011/0068856 | A1 | 3/2011 | Miyazaki et al. |
| 2011/0123048 | A1 | 5/2011 | Wang et al. |
| 2011/0234305 | A1* | 9/2011 | Lesso ...................... H02M 3/07 327/536 |

FOREIGN PATENT DOCUMENTS

CN            101924465 A     12/2010

* cited by examiner

*Primary Examiner* — MD S Elahee
(74) *Attorney, Agent, or Firm* — Muncy, Geissler, Olds & Lowe, P.C.

(57) ABSTRACT

A control circuit and method for an audio amplifier detect a signal for driving a speaker to control the switching frequency and the operation mode of a charge pump in the audio amplifier, to improve power efficiency of the audio amplifier. Preferably, a digital interface is further used to test the magnitude of the output signal of the audio amplifier, to reduce the costs of analog test. The charge pump has fewer switches and thus saves costs and die area of an integrated circuit. The control method needs only two phase control for the charge pump to generate a positive voltage and a negative voltage, and thus simplifies the operation of the circuit.

12 Claims, 25 Drawing Sheets

POWER EFFICIENCY IMPROVEMENT OF AN AUDIO AMPLIFIER BY ADAPTIVE CONTROL OF A CHARGE PUMP

FIELD OF THE INVENTION

The present invention is related generally to a charge pump and a control method thereof and, more particularly, to a charge pump and a method thereof for an audio amplifier.

BACKGROUND OF THE INVENTION

Audio amplifiers are used in audio output apparatus for driving speakers, for example, disclosed by U.S. Pat. Nos. 7,714,660 and 7,701,294 and U.S. Pat. Publication No. 2011/0123048. FIG. 1 shows a conventional two channel audio amplifier for driving speakers 16 and 18, which includes amplifying circuits 10 and 13, power stages 12 and 14, a gain setting circuit 20 and a dual mode charge pump 22. The amplifying circuit 10 and power stage 12 establish a right channel audio amplifier for generating an output signal SOR responsive to an input audio signal Sa1 to drive the speaker 16, and the amplifying circuit 13 and the power stage 14 establish a left channel audio amplifier for generating an output signal SOL responsive to an input audio signal Sa3 to drive the speaker 18. Each of the speakers 16 and 18 may be a loudspeaker or an earphone.

An operational amplifier 32 and variable resistors 24, 26, 28 and 30 establish the amplifying circuit 10 for generating differential signals Sa2P and Sa2N responsive to the audio signal Sa1. The variable resistors 24 and 26 are connected to a first input terminal and a second input terminal of the operational amplifier 32, respectively, the variable resistor 28 is connected between the first input terminal and a first output terminal of the operational amplifier 32, and the variable resistor 30 is connected between the second input terminal and a second output terminal of the operational amplifier 32. The power stage 12, which includes an operational amplifier 42 and variable resistors 34, 36, 38 and 40, generates the output signal SOR responsive to the differential signals Sa2P and Sa2N to drive the speaker 16. The variable resistor 34 is connected between the first output terminal of the operational amplifier 32 and a first input terminal of the operational amplifier 42, the variable resistor 36 is connected between the second output terminal of the operational amplifier 32 and a second input terminal of the operational amplifier 42, the variable resistor 38 is connected between the first input terminal and an output terminal of the operational amplifier 42, and the variable resistor 40 is connected between the second input terminal and a ground terminal of the operational amplifier 42.

An operational amplifier 51 and variable resistors 43, 45, 47 and 49 establish the amplifying circuit 13 for generating differential signals Sa4P and Sa4N responsive to the audio signal Sa3. The variable resistors 43 and 45 are connected to a first input terminal and a second input terminal of the operational amplifier 51, respectively, the variable resistor 47 is connected between the first input terminal and a first output terminal of the operational amplifier 51, and the variable resistor 49 is connected between the second input terminal and a second output terminal of the operational amplifier 51. The power stage 14, which includes an operational amplifier 52 and variable resistors 44, 46, 48 and 50, generates the output signal SOL responsive to the differential signals Sa4P and Sa4N to drive the speaker 18. The variable resistor 44 is connected between the first output terminal of the operational amplifier 51 and a first input terminal of the operational amplifier 52, the variable resistor 46 is connected between the second output terminal of the operational amplifier 51 and a second input terminal of the operational amplifier 52, the variable resistor 48 is connected between the first input terminal and an output terminal of the operational amplifier 52, and the variable resistor 50 is connected between the second input terminal and a ground terminal of the operational amplifier 52.

The gain setting circuit 20 provides setting signals G1, G2, G3 and G4 for controlling the variable resistors 24, 26, 28, 30, 34, 36, 38, 40, 43, 44, 45, 46, 47, 48, 49 and 50, to thereby control gains of the amplifying circuit 10 and 13 and the power stages 12 and 14, and thus determines the overall gain of the audio amplifier. In addition, the gain setting circuit 20 determines a gain information Gset according to the overall gain for the dual mode charge pump 22, to control the operation mode of the dual mode charge pump 22. The dual mode charge pump 22 converts an input voltage Vin into a positive voltage Vp and a negative voltage Vn for the audio amplifier. When the dual mode charge pump 22 is in its first mode, Vp=+Vin and Vn=−Vin, and when the dual mode charge pump 22 is in its second mode, Vp=+Vin/2 and Vn=−Vin/2.

Power efficiency is an important parameter that dominates the power consumption of an audio amplifier, especially for a battery powered system. This power efficiency refers to the ratio between the power supplied to the speakers 16 and 18 and the power supplied by the dual mode charge pump 22. As shown in FIG. 1, in the condition that the operation mode of the dual mode charge pump 22 remains unchanged, if the amplitudes of the output signals SOR and SOL reduce, the power efficiency deteriorates. FIG. 2 shows waveforms of the positive voltage Vp, the negative voltage Vn and the output signal SOR when the dual mode charge pump 22 operates in its second mode. At time t1, the output signal SOR has relatively large amplitude, so the difference $\Delta V1$ between the positive half-wave of the output signal SOR and the positive voltage Vp is relatively small, thereby having a better power efficiency. At time t2, the amplitude of the output signal SOR reduces, so the difference $\Delta V2$ between the positive half-wave of the output signal SOR and the positive voltage Vp becomes larger, thereby having a poorer power efficiency. Moreover, the conventional audio amplifier requires external automatic test equipment (ATE) for testing whether the audio loop transition is correct, and thus requires higher test costs.

Charge pumps are well known circuits. For example, as disclosed by U.S. Pat. Publication No. 2011/0234305, FIG. 3 is a dual mode charge pump 22 which includes a flying capacitor Cf1 connected between bonding pads 56 and 58, a second flying capacitor Cf2 connected between bonding pads 60 and 62, an input terminal 64 receiving an input voltage Vin, output terminals 66 and 68 connected to output capacitors Co1 and Co2, respectively, a switch SW1 connected between the input terminal 64 and the bonding pad 56, a switch SW2 connected between the bonding pad 56 and the output terminal 66, a switch SW3 connected between the bonding pads 56 and 60, a switch SW4 connected between the bonding pad 58 and a ground terminal GND, a switch SW5 connected between the bonding pads 58 and 60, a switch SW6 connected between the bonding pads 58 and 62, a switch SW7 connected between the bonding pad 62 and the ground terminal GND, a switch SW8 connected between the bonding pad 62 and the output terminal 68, and a clock generator 54 providing signals CS1, CS2, CS3, CS4, CS5, CS6, CS7 and CS8 according to a gain information Gset for controlling the switches SW1, SW2, SW3, SW4, SW5, SW6, SW7 and SW8, respectively. As shown in FIG. 3, the conventional dual mode charge pump 22 requires four bonding pads 56, 58, 60 and 62 for connection with two flying capacitors Cf1 and Cf2, causing higher packaging costs of an integrated circuit. Additionally, the dual mode charge pump 22 requiring two flying capacitors Cf1 and Cf2 needs eight switches SW1-SW8, making the costs and die area of the integrated circuit increased. Moreover, the conventional dual mode charge pump 22 can only provide the positive voltage Vp of either +Vin or +Vin/2 and the negative voltage Vn of either −Vin or −Vin/2, without capability of arbitrarily adjusting the positive voltage Vp or the negative voltage Vn.

FIG. 4 is a timing diagram of the signals CS1, CS2, CS3, CS4, CS5, CS6, CS7 and CS8 when the dual mode charge pump 22 of FIG. 3 provides the positive voltage Vp of +Vin2 and the negative voltage Vn of −Vin2. As can be seen in FIG. 4, the conventional dual mode charge pump 22 requires a three phase control to generate Vp=+Vin2 and Vn=−Vin2, causing its operation more complex.

SUMMARY OF THE INVENTION

An objective of the present invention is to provide a control circuit and a method for improving power efficiency of an audio amplifier.

Another objective of the present invention is to provide a control circuit and a method for detecting signals driving speakers to control operation modes and a switching frequency of a charge pump.

Yet another objective of the present invention is to provide a control circuit and a method for performing self-test to an audio amplifier.

Still another objective of the present invention is to provide a charge pump and a control method thereof for arbitrarily adjusting a pumped voltage thereof.

A further objective of the present invention is to provide a charge pump and a control method thereof for reducing the number of switches thereof.

Still another objective of the present invention is to provide a control method for a charge pump that is simpler to operate.

According to the present invention, a control circuit and a method for an audio amplifier detect a signal used to drive a speaker to control a switching frequency and an operation mode of a charge pump, thereby improving power efficiency. The control circuit may use a digital interface to automatically test whether the magnitude of the output signal of the audio amplifier is correct, thereby saving costs for analog tests.

According to the present invention, a charge pump requires fewer switches, to reduce costs and die area of an integrated circuit. The control method of the charge pump needs only a two phase control, so its operation is simpler. The charge pump and its control method can generate any possible positive and negative voltages, so have improved adaptability.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
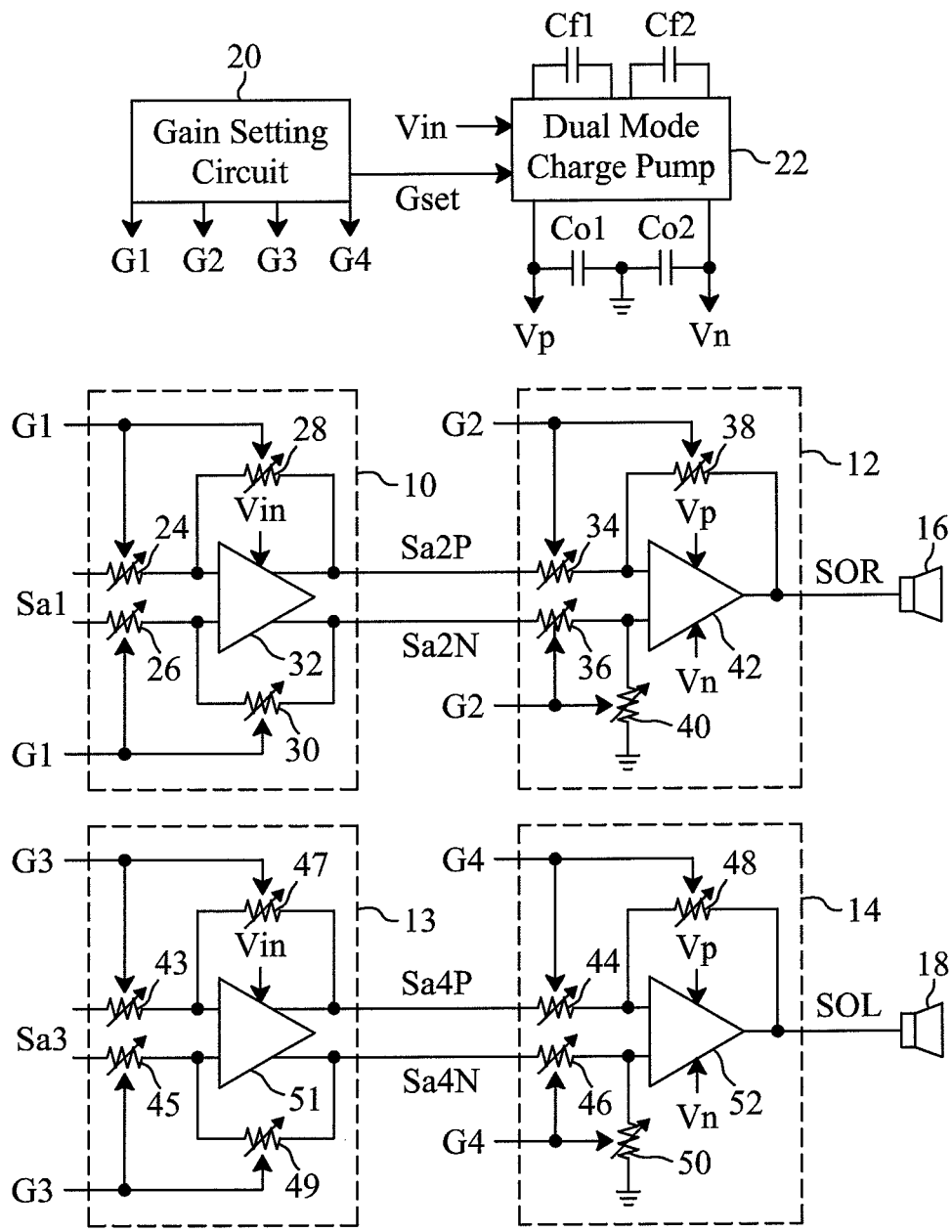
FIG. 1 is a circuit diagram of a conventional two channel audio amplifier.
Figure 2:
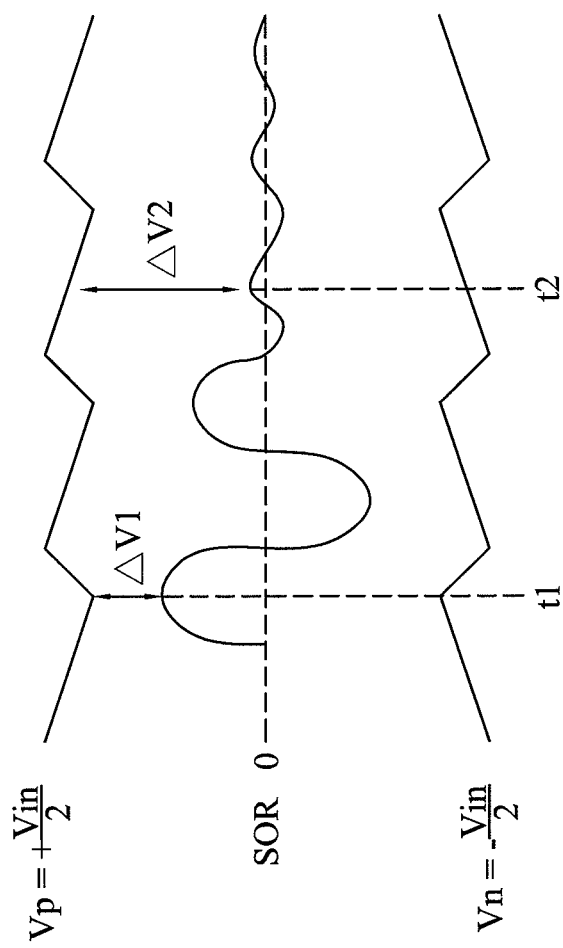
FIG. 2 is a waveform diagram of the positive voltage Vp, the negative voltage Vn and the output signal SOR shown in FIG. 1.
Figure 5:
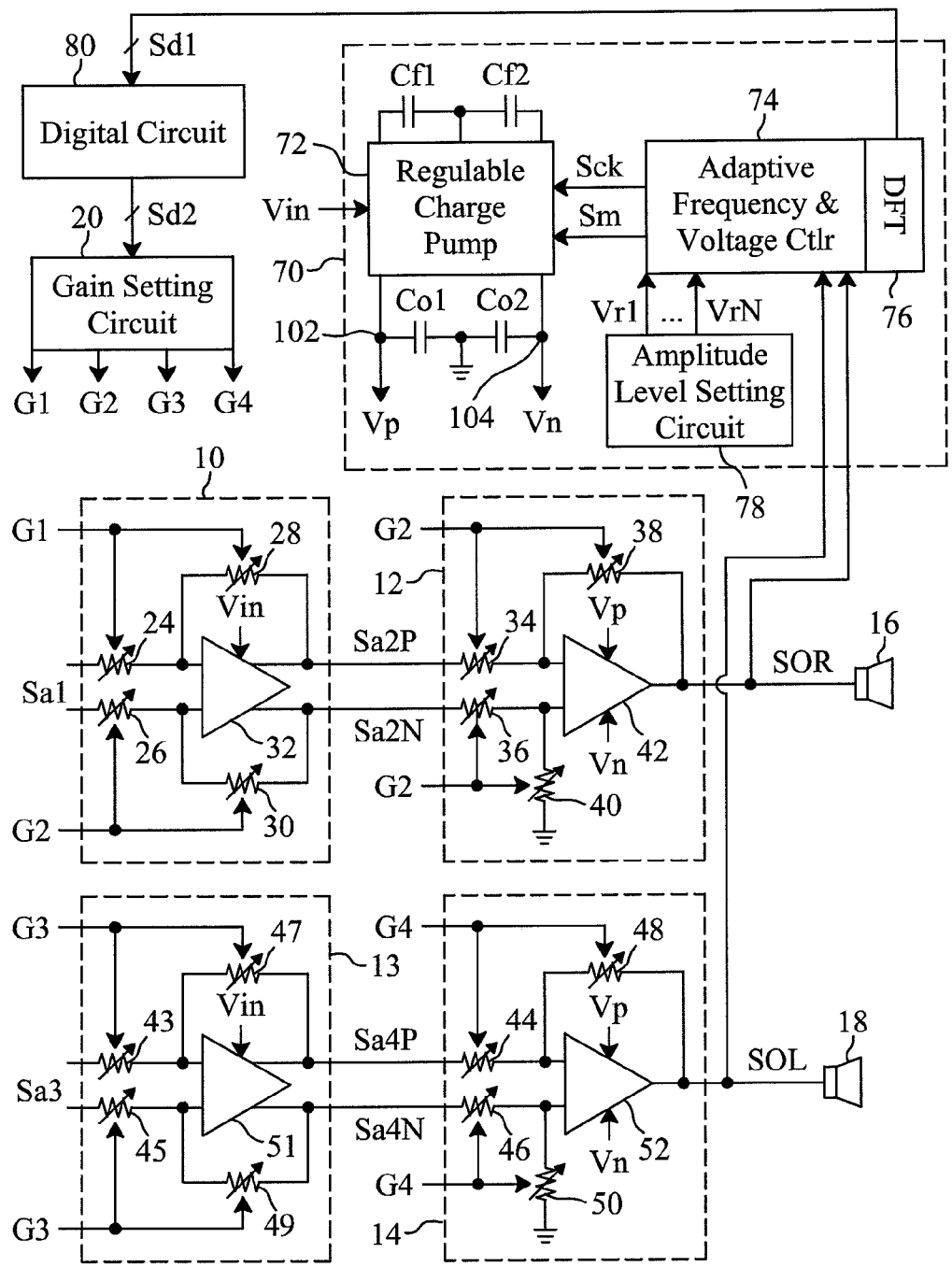
FIG. 5 is a circuit diagram of an audio output apparatus using a control circuit according to the present invention.

FIG. 5 shows an audio output apparatus using a control circuit 70 according to the present invention in the audio amplifier of the audio output apparatus. In this embodiment, the amplifying circuits 10 and 13, power stages 12 and 14, speakers 16 and 18 and gain setting circuits 20 are the same as shown in FIG. 1. The control circuit 70 includes a regulable charge pump 72, an adaptive frequency and voltage controller 74, an amplitude level setting circuit 78, flying capacitors Cf1 and Cf2 and output capacitors Co1 and Co2. The flying capacitor Cf1 has its first and second terminals connected to the regulable charge pump 72, the flying capacitor Cf2 has its first terminals connected to a second terminal of the flying capacitor Cf1, and its second terminal connected to the regulable charge pump 72. The output capacitors Co1 and Co2 are connected to output terminals 102 and 104 of the regulable charge pump 72, respectively. The regulable charge pump 72 converts an input voltage Vin into a variable positive voltage Vp and a variable negative voltage Vn. Particularly, the regulable charge pump 72 has its operation mode and switching frequency determined by a clock signal Sck and a mode select signal Sm provided by the adaptive frequency and voltage controller 74, instead of the gain setting circuit 20. The amplitude level setting circuit 78 provides a plurality of reference voltages Vr1-VrN for the adaptive frequency and voltage controller 74, where N is an integer. The adaptive frequency and voltage controller 74 detects the output signals SOR and SOL of the power stages 12 and 14, and compares the output signals SOR and SOL with the reference voltages Vr1-VrN to identify the levels of the output signals SOR and SOL and in turn to determine the clock signal Sck and the mode select signal Sm. The digital circuit 80 generates a signal Sd2 for the gain setting circuit 20 according to a signal Sd1 provided by the adaptive frequency and voltage controller 74. The gain setting circuit 20 generates the setting signals G1, G2, G3 and G4 according to the signal Sd2 for controlling the variable resistors 24, 26, 28, 30, 34, 36, 38, 40, 43, 44, 45, 46, 47, 48, 49 and 50, to control the gains of the amplifying circuits 10 and 13 and the power stages 12 and 14.

Figure 6:
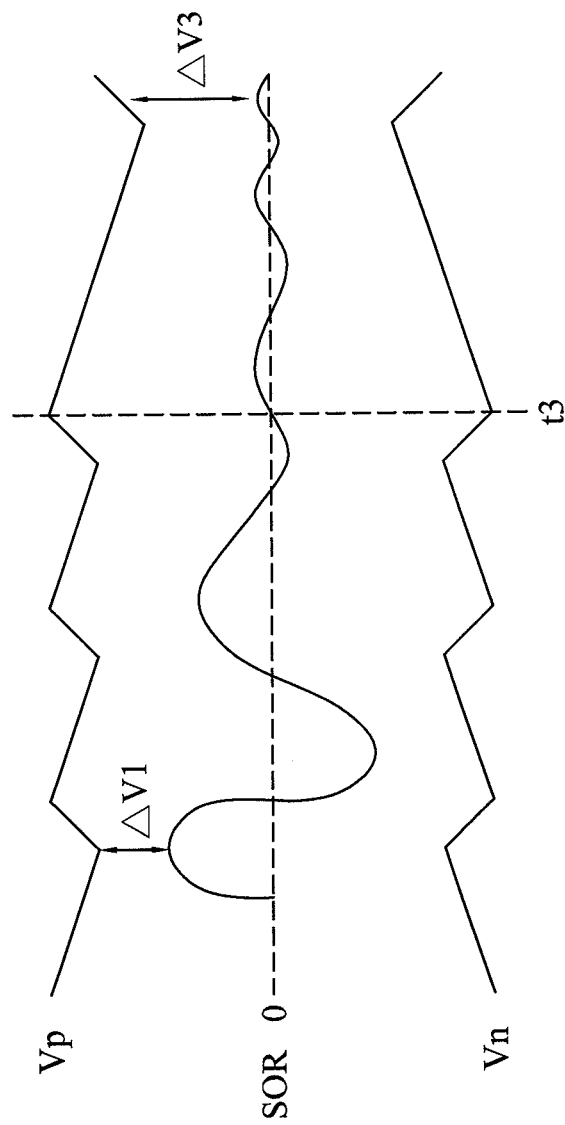
FIG. 6 is a waveform diagram of the positive voltage Vp, the negative voltage Vn and the output signal SOR shown in FIG. 5.

In the embodiment shown in FIG. 5, the adaptive frequency and voltage controller 74 further includes a design-for-test (DFT) circuit 76 to identify whether the magnitude of the output signals SOR and SOL of the audio amplifier is correct, so there is no need for an external ATE. The DFT circuit 76 is a digital interface, helpful to save costs for analog tests. In addition, the adaptive frequency and voltage controller 74 may change the switching frequency of the regulable charge pump 72 according to the levels of the output signals SOR and SOL, so that under the same operation mode, when the amplitudes of the output signals SOR and SOL reduce, the adaptive frequency and voltage controller 74 reduces the switching frequency of the regulable charge pump 72 to improve power efficiency. As shown in FIG. 6, in the condition that the operation mode of the regulable charge pump 72 is fixed, when the amplitude of the output signal SOR reduces, as shown at time t3, the adaptive frequency and voltage controller 74 reduces the switching frequency of the regulable charge pump 72 to reduce the difference between the output signal SOR and the positive voltage Vp or the negative voltage Vn provided by the regulable charge pump 72, thereby improving the power efficiency of the audio amplifier.

Figure 7:
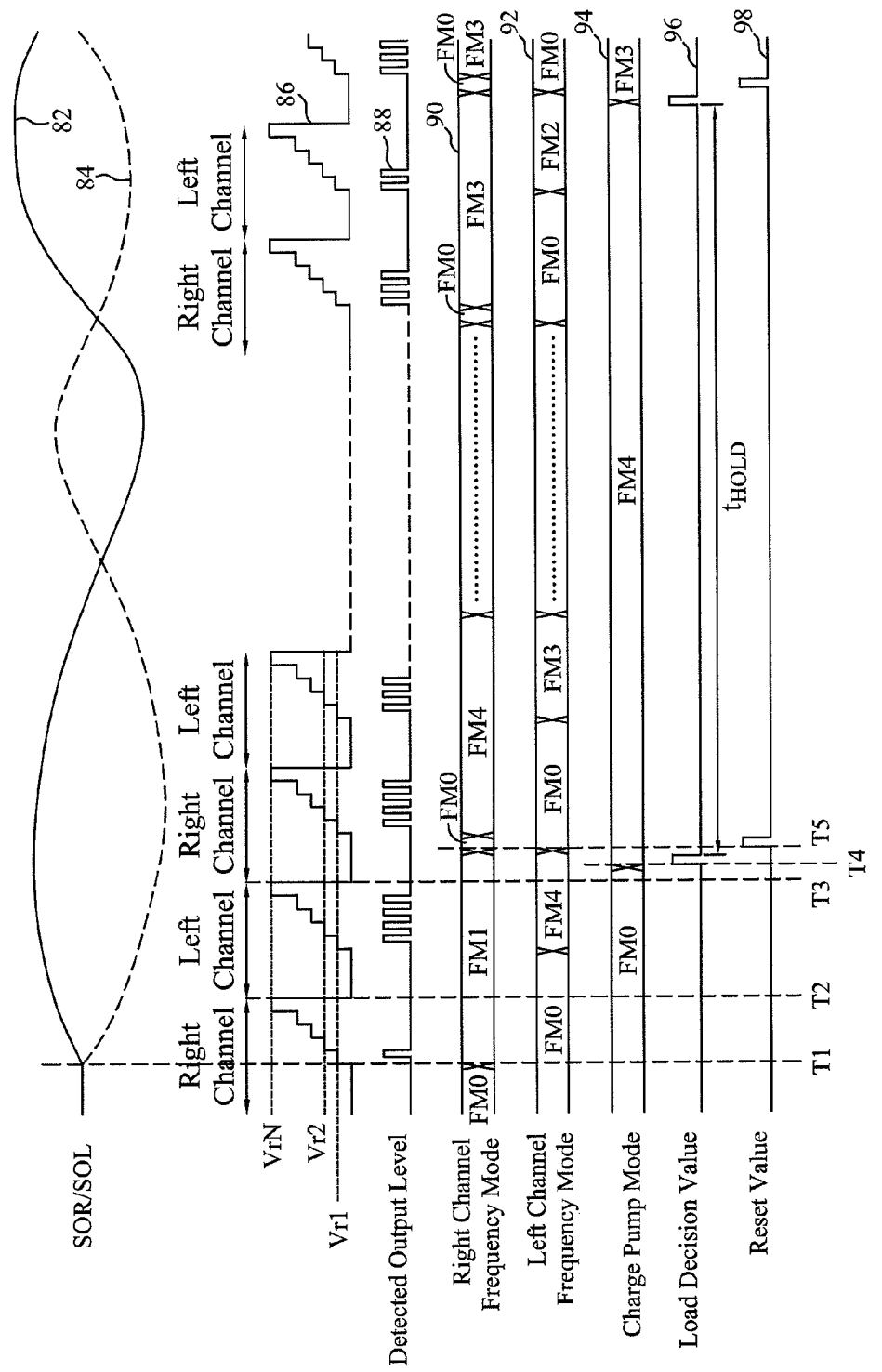
FIG. 7 is a waveform diagram showing the operation of the adaptive frequency and voltage controller of FIG. 5.

FIG. 7 illustrates operation of the adaptive frequency and voltage controller 74 shown in FIG. 5, in which the waveform 82 represents the output signal SOR, the waveform 84 represents the output signal SOL, the waveform 86 represents reference voltages Vr1-VrN, the waveform 88 represents the detected output level, the eye diagram 90 represents the right channel frequency mode, the eye diagram 92 represents the left channel frequency mode, the eye diagram 94 represents the charge pump mode, the waveform 96 represents the load decision value, and the waveform 98 represents the reset value. Referring to FIGS. 5 and 7, during the period between time T1 and time T2, the adaptive frequency and voltage controller 74 detects the level of the output signal SOR, and compares the output signal SOR with each of the reference voltages Vr1-VrN in order, to obtain the detected output level as shown by the waveform 88. The detected output level between the time T1 and time T2 only generates one pulse, meaning that the output signal SOR is greater than the reference voltage Vr1 but smaller than the reference voltage Vr2, so the right channel frequency mode is set as FM1, as shown by the eye diagram 90. Similarly, if the detected output level has two pulses, meaning that the output signal SOR is greater than the reference voltage Vr2 but smaller than the reference voltage Vr3, so the right channel or left channel frequency mode is set as FM2. In the event that the detected output level has three pulses, meaning that the output signal SOR is greater than the reference voltage Vr3 but smaller than the reference voltage Vr4, the right channel or left channel frequency mode is set as FM3; and so forth. In this embodiment, the frequency of the frequency mode FM1 is lower than the frequency of the frequency mode FM2, the frequency of the frequency mode FM2 is lower than the frequency of the frequency mode FM3, and so forth. During the period between time T2 and time T3, the adaptive frequency and voltage controller 74 compares the output signal SOL with each of the reference voltages Vr1-VrN in order, to identify the level of the output signal SOL, thereby obtaining the detected output level as shown by the waveform 88, so the left channel frequency mode is set as FM4, as shown by the eye diagram 92. At time T4, the load detection value is triggered, as shown by the waveform 96. Thus, the adaptive frequency and voltage controller 74 will select the frequency mode FM4 that has a higher frequency among the right channel and left channel frequency modes as the charge pump mode, as shown by the eye diagram 94, and accordingly generates the clock signal Sck and the mode select signal Sm that determine the switching frequency and the operation mode of the regulable charge pump 72. At time T5, the resetting value is triggered, as shown by the waveform 98, so the adaptive frequency and voltage controller 74 will reset the right channel and left channel frequency mode as FM0.

Figure 8:
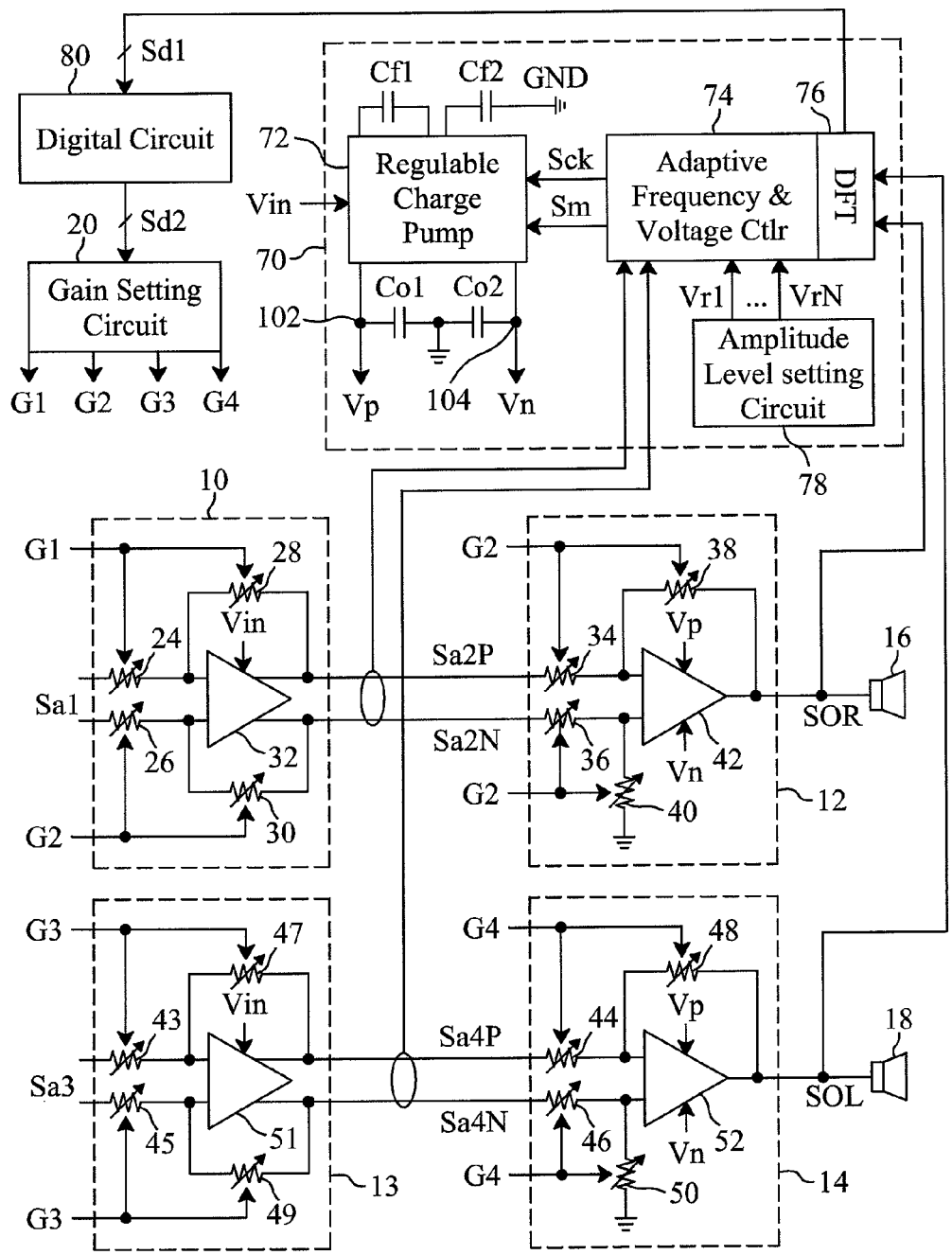
FIG. 8 is a circuit diagram of an audio output apparatus using a control circuit according to a second embodiment of the present invention.

As shown in FIG. 5, the input signals Sa2P and Sa2N of the power stage 12 are related to the output signal SOR, and the input signals Sa4P and Sa4N of the power stage 14 are related to the output signal SOL. Therefore, as shown in FIG. 8, for determining the clock signal Sck and the mode select signal Sm, the adaptive frequency and voltage controller 74 may detect the input terminal signals Sa2P, Sa2N, Sa4P and Sa4N of the power stage 12 and 14 instead, but not the output signals SOR and SOL. In the embodiment shown in FIG. 8, the DFT circuit 76 identifies whether the magnitude of the output signals SOR and SOL of the audio amplifier is correct as done in the embodiment shown in FIG. 5. The adaptive frequency and voltage controller 74 of the embodiment shown in FIG. 8 operates as the same way of the embodiment shown in FIG. 5. In other embodiments, the adaptive frequency and voltage controller 74 may determine the clock signal Sck and the mode select signal Sm by detecting other signals related to the output signals SOR and SOL.

Figure 9:
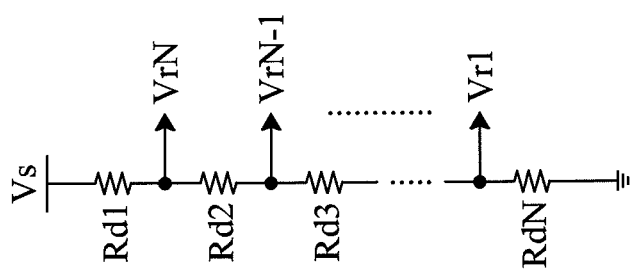
FIG. 9 is a circuit diagram of an embodiment for the amplitude level setting circuit shown in FIG. 5.

FIG. 9 is an embodiment for the amplitude level setting circuit 78 shown in FIG. 5, which includes a plurality of serially connected resistors Rd1-RdN to divide a voltage Vs to generate the reference voltages Vr1-VrN for setting the corresponding switching modes FM0-FMN.

Figure 10:
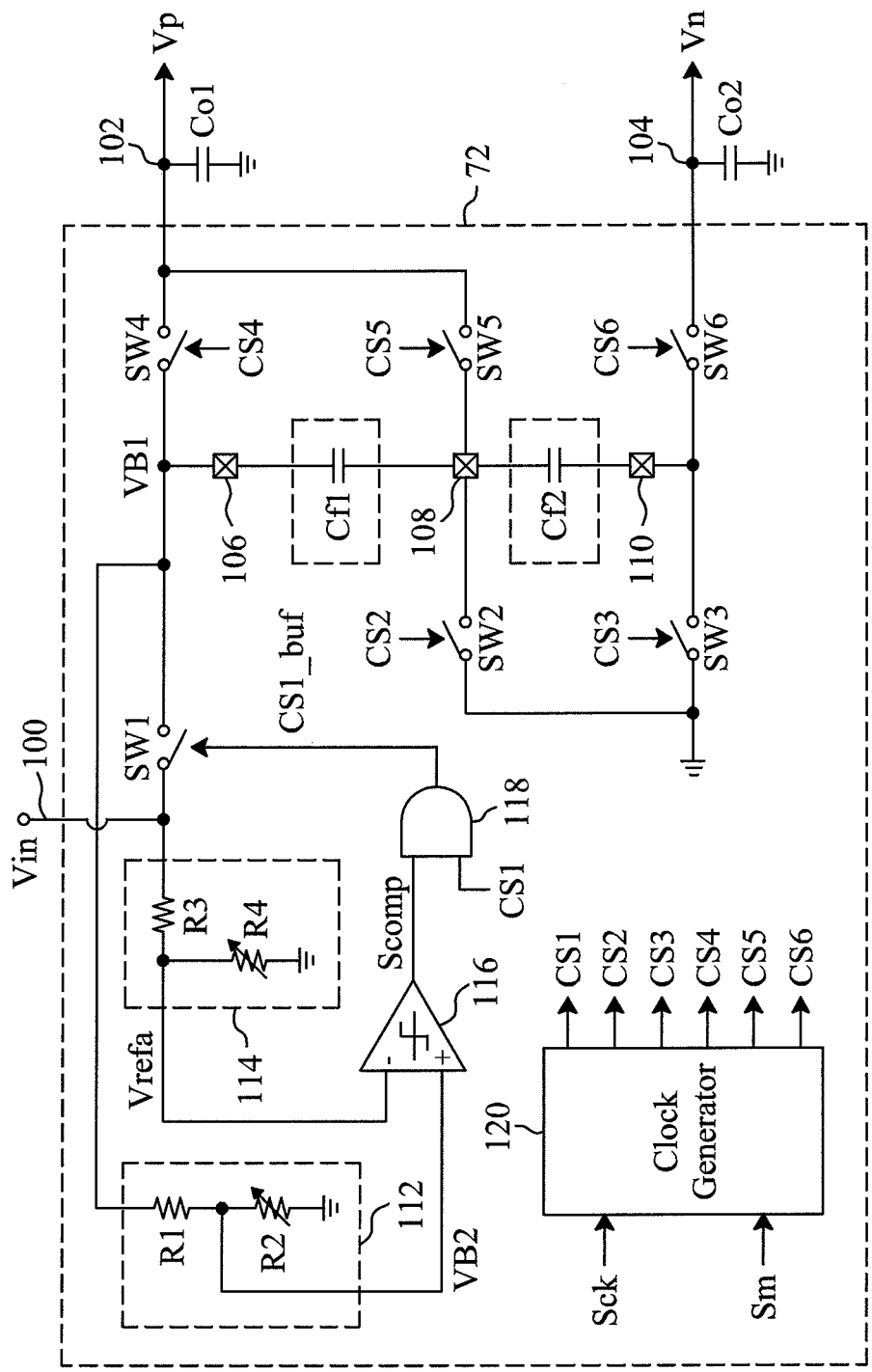
FIG. 10 is a circuit diagram of a first embodiment for the regulable charge pump shown in FIG. 5.

FIG. 10 is a first embodiment for the regulable charge pump 72 shown in FIG. 5, which includes an input terminal 100 to receive the input voltage Vin, an output terminal 102 connected to the output capacitor Co1 to provide the positive voltage Vp, an output terminal 104 connected to the output capacitor Co2 to provide the negative voltage Vn, bonding pads 106 and 108 to be connected with the flying capacitor Cf1 therebetween, bonding pads 110 and 108 to be connected with the flying capacitor Cf2 therebetween, a switch SW1 connected between the input terminal 100 and the bonding pad 106 and controlled by a signal CS1_buf, a switch SW2 connected between the bonding pad 108 and a ground terminal GND and controlled by a signal CS2, a switch SW3 connected between the bonding pad 110 and the ground terminal GND and controlled by a signal CS3, a switch SW4 connected between the bonding pad 106 and the output terminal 102 and controlled by a signal CS4, a switch SW5 connected between the bonding pad 108 and the output terminal 102 and controlled by a signal CS5, a switch SW6 connected between the bonding pad 110 and the output terminal 104 and controlled by a signal CS6, a clock generator 120 to determine the signals CS1, CS2, CS3, CS4, CS5 and CS6 according to the clock signal Sck and the mode select signal Sm, a detector 112 to detect the voltage VB1 of the bonding pad 106 to generate a voltage VB2, a reference voltage generator 114 to provide a variable reference voltage Vrefa, a comparator 116 to compare the voltage VB2 with the reference voltage Vrefa to generate a comparison signal Scomp, and an AND gate 118 to determine the signal CS1_buf according to the signals Scomp and CS1. As shown in FIG. 10, this regulable charge pump 72 has only six switches SW1-SW6 and needs only three bonding pads to be connected with two flying capacitors Cf1 and Cf2. In comparison with the charge pump 22 shown in FIG. 3, the regulable charge pump 72 shown in FIG. 10 saves two switches and one bonding pad, thereby saving costs and die area.

Figure 3:
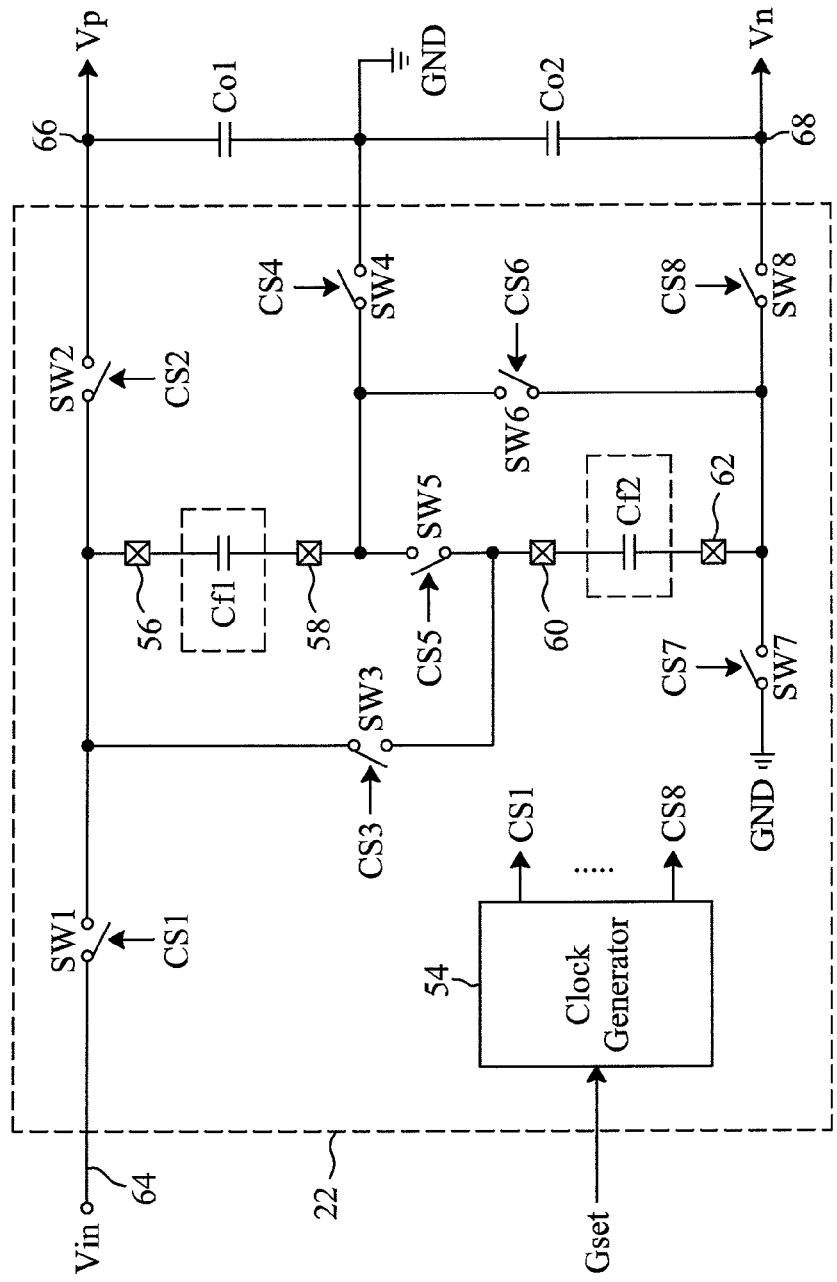
FIG. 3 is a circuit diagram of a conventional dual mode charge pump.
Figure 4:
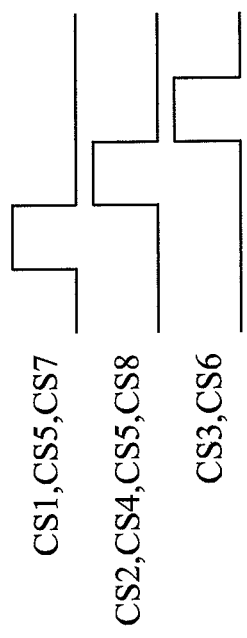
FIG. 4 is a timing diagram of signals CS1, CS2, CS3, CS4, CS5, CS6, CS7 and CS8 shown in FIG. 3.

The dual mode charge pump 22 shown in FIG. 3 can only provide the positive voltage Vp of either +Vin or +Vin/2 and the negative voltage Vn of either −Vin or −Vin/2, without capability of arbitrarily adjusting the positive voltage Vp and the negative voltage Vn. The regulable charge pump 72 shown in FIG. 10 uses the detector 112, reference voltage generator 114 and comparator 116 to control the voltage VB1 of the bonding pad 106, thereby generating the positive voltage Vp and the negative voltage Vn at will. In further details, the detector 112 includes serially connected resistors R1 and R2 to divide the voltage. VB1 to generate the voltage VB2, the reference voltage generator 114 includes serially resistors R3 and R4 to divide the input voltage Vin to generate the reference voltage Vrefa, where the resistor R4 is a variable resistor, and by changing the resistor R4, the reference voltage Vrefa can be changed. When the clock generator 120 triggers the signal CS1 to turn on the switch SW1, the voltage VB1 of the bonding pad 106 increases, so the voltage VB2 also increases. When the voltage VB2 becomes greater than the reference voltage Vrefa, meaning that the voltage VB1 reaches a target value, the comparison signal Scomp generated by the comparator 116 transits to low level and thus turns off the switch SW1. Then when the voltage VB2 becomes smaller than the voltage Vrefa, the comparator 116 will again assert the comparison signal Scomp to high level. By this way, changing the reference voltage Vrefa can control the voltage VB1, thereby adjusting the positive voltage Vp and the negative voltage Vn at will.

Figure 11:
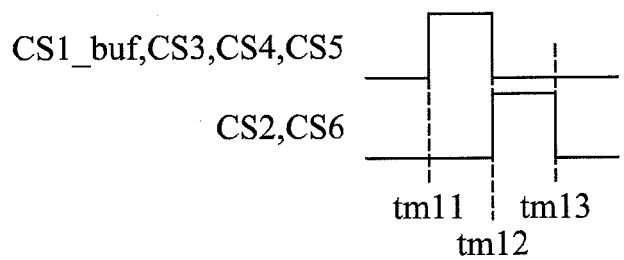
FIG. 11 is a timing diagram of the regulable charge pump shown in FIG. 10 in its first mode.
Figure 12:
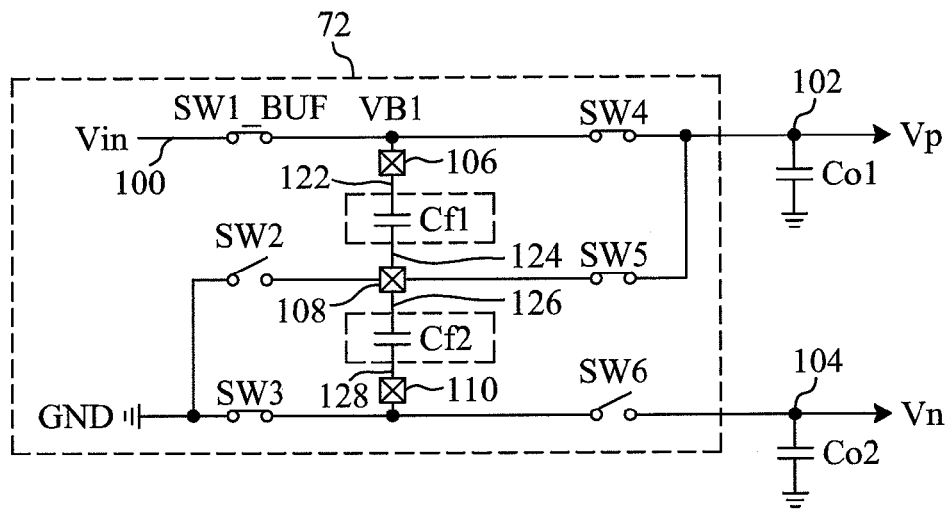
FIG. 12 is a circuit diagram of the regulable charge pump shown in FIG. 10 in its first operation state of its first mode.

FIG. 11 is a timing diagram of the regulable charge pump 72 shown in FIG. 10 in its first mode. When the regulable charge pump 72 is in its first operation state of its first mode, as during the period between time tm11 and time tm12, the signals CS1_buf, CS3, CS4 and CS5 turn on the switches SW1, SW3, SW4 and SW5, and the signals CS2 and CS6 turn off the switches SW2 and SW6. As shown in FIG. 12, the first terminal 122 of the flying capacitor Cf is connected to its second terminal 124, the first terminal 126 of the flying capacitor Cf2 is connected to the output capacitor Co1 and the input terminal 100, and the second terminal 128 of the flying capacitor Cf2 is connected to the ground terminal GND. In this case the first terminal 122 and the second terminal 124 of the flying capacitor Cf1 become short circuit to each other, so the flying capacitor Cf1 is disabled to stop working, and the flying capacitor Cf2 is connected in parallel with the output capacitor Co1, so the input voltage Vin charges the flying capacitor Cf2 and the output capacitor Co1 to increase the voltage VB1, thereby generating the positive voltage Vp=VB1. When the voltage VB1 (or the positive voltage Vp) reaches a target value, i.e. VB2=Vrefa, the regulable charge pump 72 enters its second operation state of the first mode.

Figure 13:
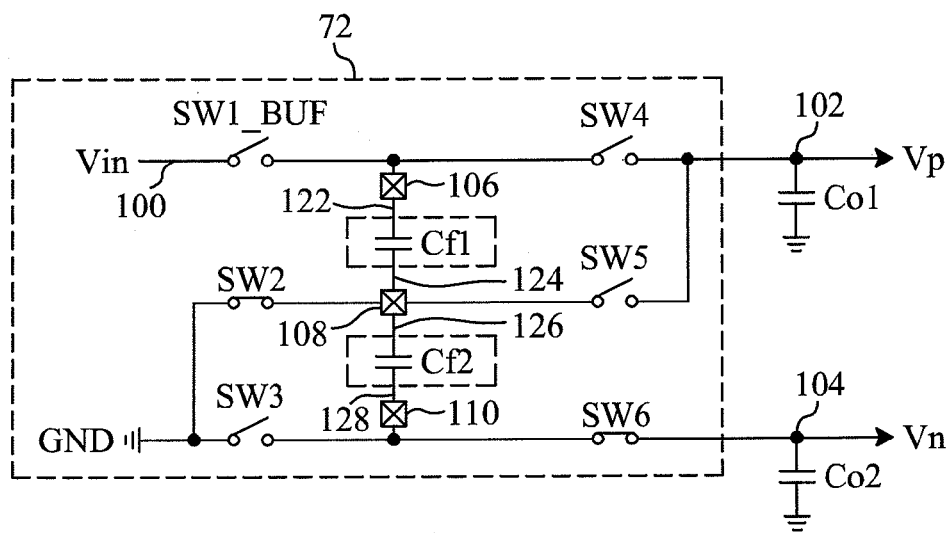
FIG. 13 is a circuit diagram of the regulable charge pump shown in FIG. 10 in its second operation state of its first mode.

When the regulable charge pump 72 is in its second operation state of the first mode, as during the period between the time tm12 and time tm13 as shown in FIG. 11, the signals CS1_buf, CS3, CS4 and CS5 turn off the switches SW1, SW3, SW4 and SW5, and the signals CS2 and CS6 turn on the switches SW2 and SW6. As shown in FIG. 13, the first terminal 122 of the flying capacitor Cf1 is floating, the first terminal 126 of the flying capacitor Cf2 is connected to the ground terminal GND, and the second terminal 128 of the flying capacitor Cf2 is connected to the output capacitor Co2. In this case the first terminal 122 of the flying capacitor Cf1 is floating, so the flying capacitor Cf1 is disabled to stop working, and the flying capacitor Cf2 charges the output capacitor Co2, thereby generating the negative voltage Vp=−VB1.

Figure 14:
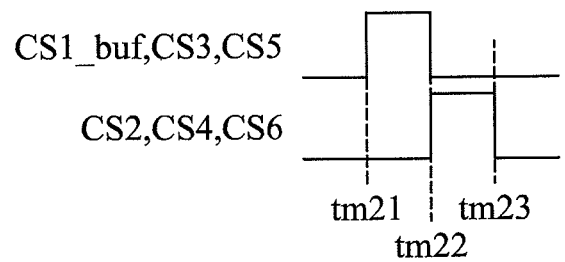
FIG. 14 is a timing diagram of the regulable charge pump shown in FIG. 10 in its second mode.
Figure 15:
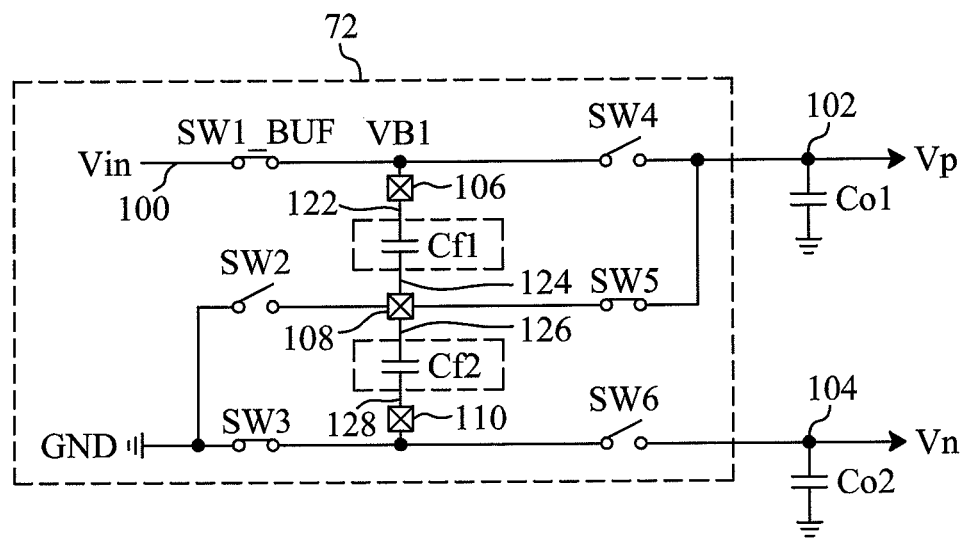
FIG. 15 is a circuit diagram of the regulable charge pump shown in FIG. 10 in its first operation state of its second mode.

FIG. 14 is a timing diagram of the regulable charge pump 72 shown in FIG. 10 in its second mode. When the regulable charge pump 72 is in its first operation state of the second mode, as during the period between time tm21 and time tm22, the signals CS1_buf, CS3 and CS5 turn on the switches SW1, SW3 and SW5, and the signals CS2, CS4 and CS6 turn off the switches SW2, SW4 and SW6. As shown in FIG. 15, the first terminal 122 of the flying capacitor Cf1 is connected to the input terminal 100, the first terminal 126 of the flying capacitor Cf2 is connected to the second terminal 124 of the flying capacitor Cf1 and the output capacitor Co1, and the second terminal of the flying capacitor Cf2 is connected to the ground terminal GND. In this case the input voltage Vin charges the flying capacitors Cf1 and Cf2 and the output capacitor Co1, to generate the voltage VB1 and the positive voltage Vp. Assuming that, in this embodiment, Cf1=Cf2+Co1, the flying capacitors Cf1 and Cf2 and the output capacitor Co1 will divide the voltage VB1 to generate the positive voltage Vp=VB1/2. When the voltage VB1 reaches a target value, i.e. VB2=Vrefa, the regulable charge pump 72 enters the second operation state of the second mode.

Figure 16:
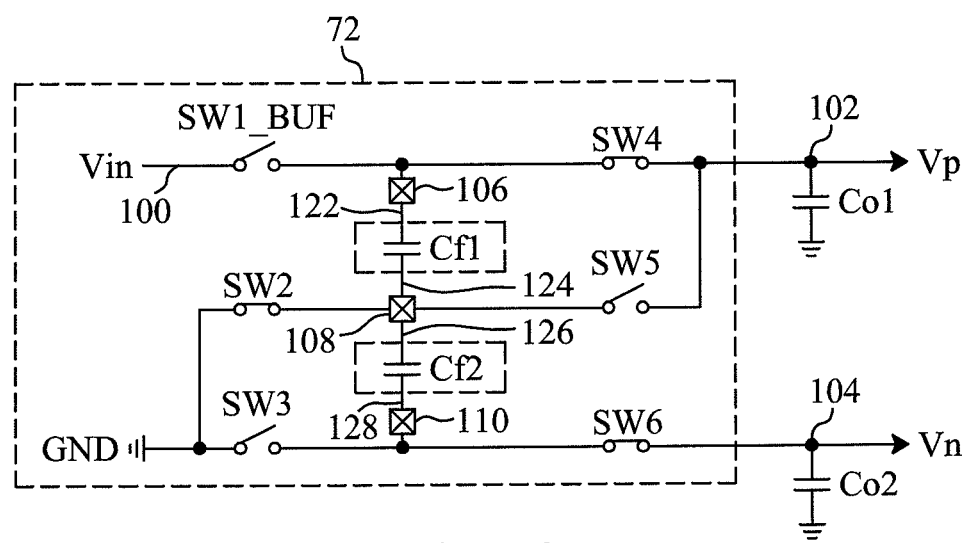
FIG. 16 is a circuit diagram of the regulable charge pump shown in FIG. 10 in its second operation state of its second mode.

When the regulable charge pump 72 is in the second operation state of the second mode, as during the period between time tm22 and time tm23, the signals CS1_buf, CS3 and CS5 turn off the switches SW1, SW3 and SW5, and the signals CS2, CS4 and CS6 turn on the switches SW2, SW4 and SW6. As shown in FIG. 16, the first terminal 122 of the flying capacitor Cf1 is connected to the output capacitor Co1, the second terminal 124 of the flying capacitor Cf1 and the first terminal 126 of the flying capacitor Cf2 are both connected to the ground terminal GND, and the second terminal 128 of the flying capacitor Cf2 is connected to the output capacitor Co2. In this case the flying capacitor Cf2 charges the output capacitor Co2 to generate the negative voltage Vn=−VB1/2.

Figure 17:
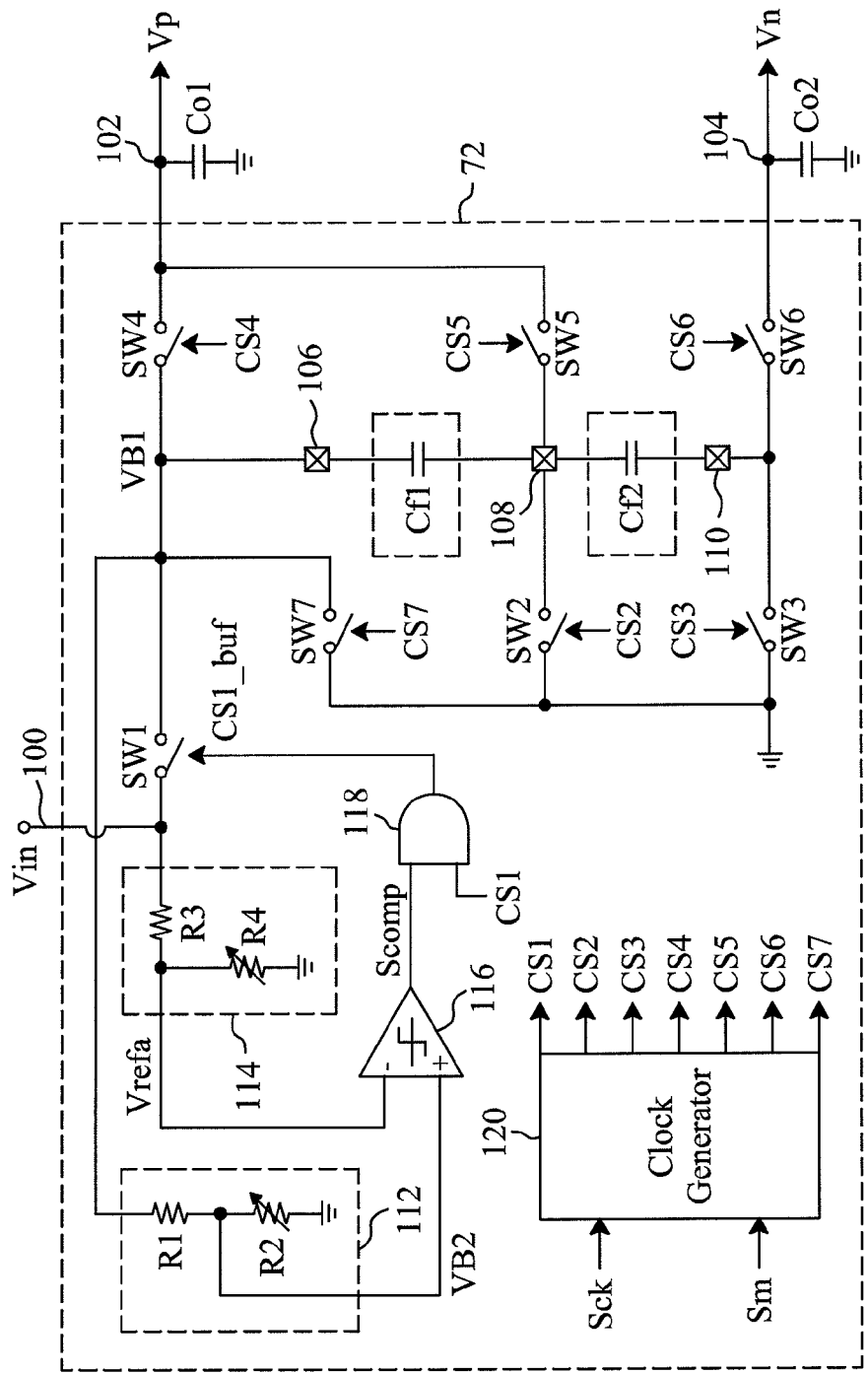
FIG. 17 is a circuit diagram of a second embodiment for the regulable charge pump shown in FIG. 5.

FIG. 17 is a second embodiment for the regulable charge pump 72 shown in FIG. 5. In addition to the input terminal 100, output terminals 102 and 104, bonding pads 106, 108 and 110, detector 112, reference voltage generator 114, comparator 116, AND gate 118, clock generator 120 and switches SW1-SW6 as those shown in FIG. 10, a switch SW7 is further included and connected between the bonding pad 106 and the ground terminal GND. The clock generator 120 also determines a signal CS7 according to the clock signal Sck and the mode select signal Sm to control the switch SW7. The regulable charge pump 72 shown in FIG. 17 has only seven switches and needs only three bonding pads for connection with two flying capacitors Cf1 and Cf2. In comparison with the charge pump 22 shown in FIG. 3, the regulable charge pump 72 shown in FIG. 17 saves one switch and one bonding pad, thereby saving costs and die area of an integrated circuit.

Figure 18:
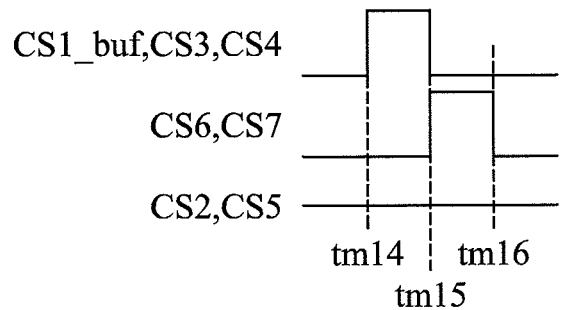
FIG. 18 is a timing diagram of the regulable charge pump shown in FIG. 17 in its first mode.
Figure 19:
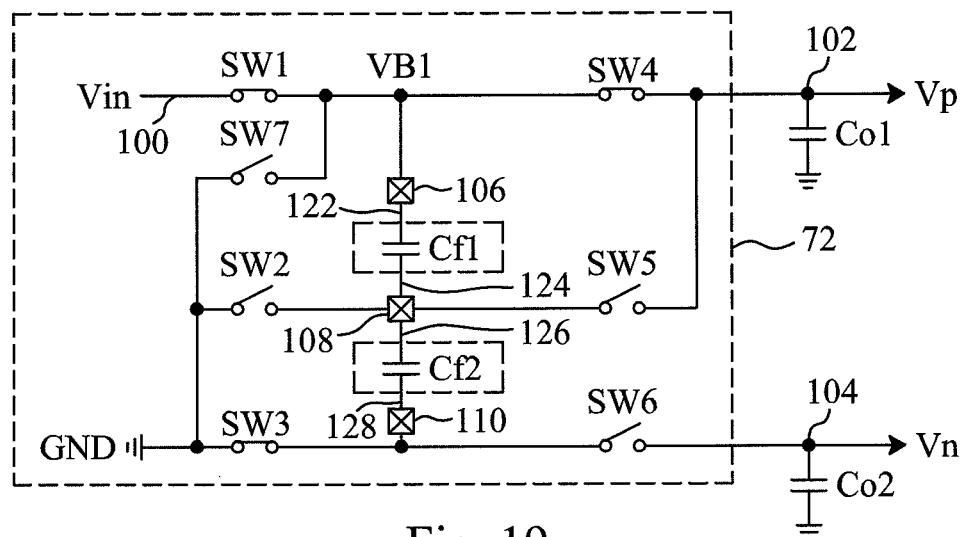
FIG. 19 is a circuit diagram of the regulable charge pump shown in FIG. 17 in its first operation state of its first mode.

FIG. 18 is a timing diagram of the regulable charge pump 72 shown in FIG. 17 in its first mode. When the regulable charge pump 72 is in the first operation state of the first mode, as during the period between time tm14 and time tm15, the signals CS1_buf, CS3 and CS4 turn on the switches SW1, SW3 and SW4, and the signals CS2, CS5, CS6 and CS7 turn off the switch SW2, SW5, SW6 and SW7. As shown in FIG. 19, the first terminal 122 of the flying capacitor Cf1 is connected to the input terminal 100 and the output capacitor Co1, the second terminal 124 of the flying capacitor Cf1 is connected to the first terminal 126 of the flying capacitor Cf2, and the second terminal 128 of the flying capacitor Cf2 is connected to the ground terminal GND. In this case the input voltage Vin charges the flying capacitors Cf1 and Cf2 and the output capacitor Co1 to generate the positive voltage Vp=VB1. When the voltage VB1 (or the positive voltage Vp) reaches a target value, i.e. VB2=Vrefa, the regulable charge pump 72 enters the second operation state of the first mode.

Figure 20:
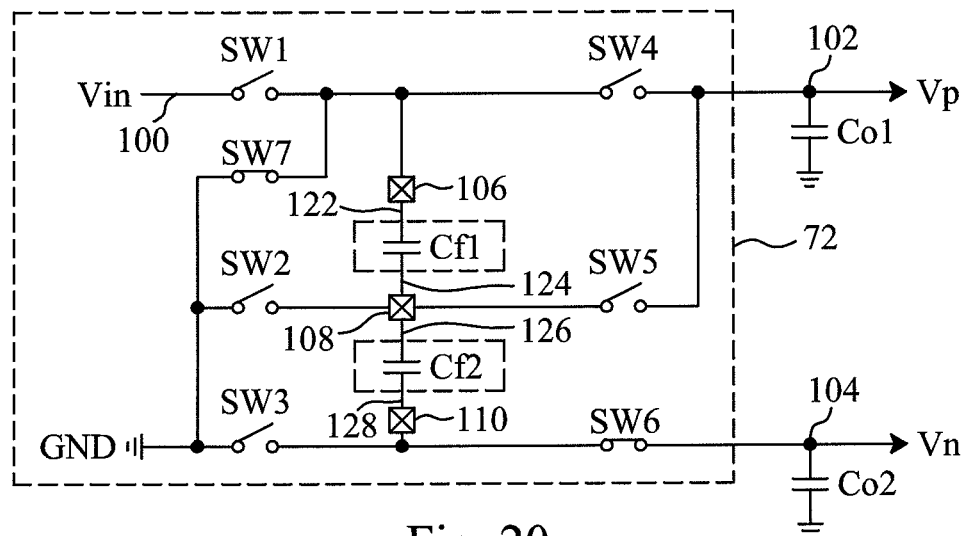
FIG. 20 is a circuit diagram of the regulable charge pump shown in FIG. 17 in its second operation state of its first mode.

When the regulable charge pump 72 is in the second operation state of the first mode, as during the period between time tm15 and time tm16, the signals CS1_buf, CS2, CS3, CS4 and CS5 turn off the switches SW1, SW2, SW3, SW4 and SW5, and the signals CS6 and CS7 turn on the switches SW6 and SW7. As shown in FIG. 20, the first terminal 122 and the second terminal 124 of the flying capacitor Cf1 are connected to the ground terminal GND and the first terminal 126 of the flying capacitor Cf2, respectively, and the second terminal 128 of the flying capacitor Cf2 is connected to the output capacitor Co2. In this case the flying capacitors Cf1 and Cf2 charges the output capacitor Co2 to generate the negative voltage Vn=−VB1.

Figure 21:
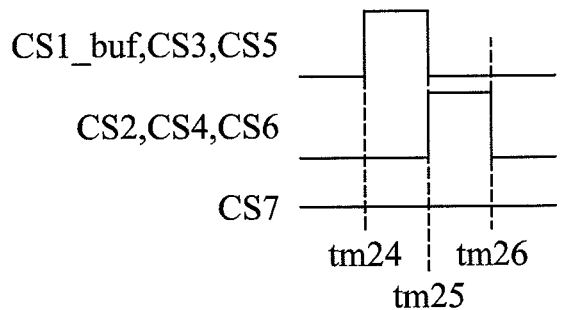
FIG. 21 is a timing diagram of the regulable charge pump shown in FIG. 17 in its second mode.
Figure 22:
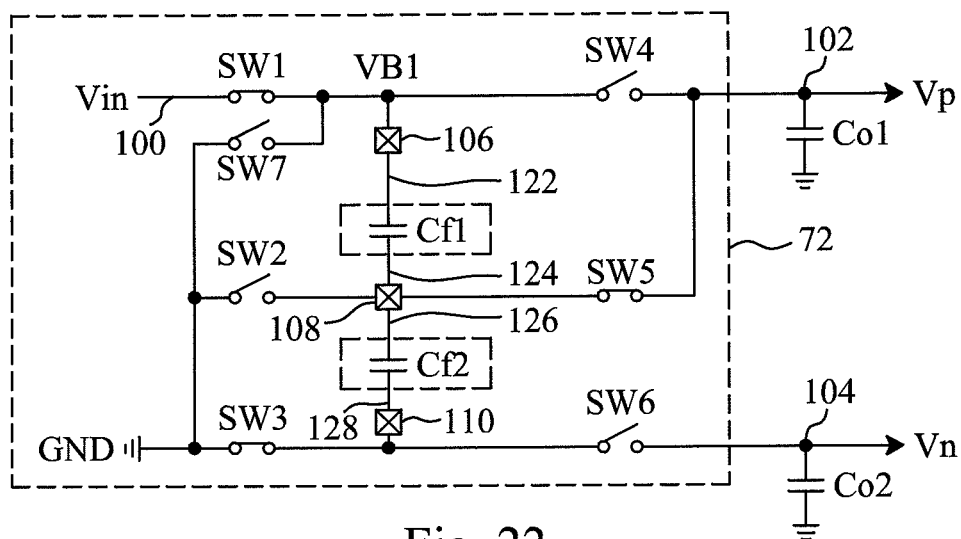
FIG. 22 is a circuit diagram of the regulable charge pump shown in FIG. 17 in its first operation state of its second mode.

FIG. 21 is a timing diagram of the regulable charge pump 72 shown in FIG. 17. When the regulable charge pump 72 is in the first operation state of the second mode, as during the period between time tm24 and time tm25, the signals CS1_buf, CS3 and CS5 turn on the switches SW1, SW3 and SW5, and the signals CS2, CS4, CS6 and CS7 turn off the switches SW2, SW4, SW6 and SW7. As shown in FIG. 22, the first terminal 122 of the flying capacitor Cf1 is connected to the input terminal 100, the second terminal 124 of the flying capacitor Cf1 is connected to the output capacitor Co1 and the first terminal 126 of the flying capacitor Cf2, and the second terminal 128 of the flying capacitor Cf2 is connected to the ground terminal GND. In this case the input voltage Vin charges the flying capacitors Cf1 and Cf2 and the output capacitor Co1 to generate the voltage VB1 and the positive voltage Vp. Assuming that, in this embodiment, Cf1=Cf2+Co1, the flying capacitors Cf1 and Cf2 and the output capacitor Co1 will divide the voltage VB1 to generate the positive voltage Vp=VB1/2. When the voltage VB1 reaches a target value, i.e. VB2=Vrefa, the regulable charge pump 72 enters the second operation state of the second mode.

Figure 23:
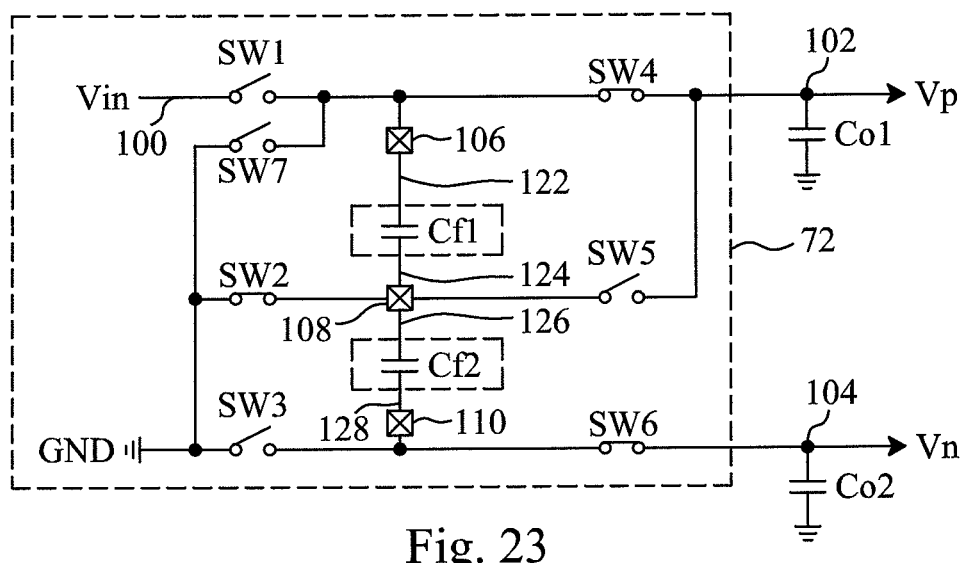
FIG. 23 is a circuit diagram of the regulable charge pump shown in FIG. 17 in its second operation state of its second mode.

When the regulable charge pump 72 is in the second operation state of the second mode, as during the period between time tm25 and time tm26, the signals CS1_buf, CS3, CS5 and CS7 turn off the switches SW1, SW3, SW5 and SW7, and the signals CS2, CS4 and CS6 turn on the switches SW2, SW4 and SW6. As shown in FIG. 23, the first terminal 122 and the second terminal 124 of the flying capacitor Cf1 are connected to the output capacitor Co1 and the ground terminal GND, respectively, and the first terminal 126 and the second terminal 128 of the flying capacitor Cf2 are connected to the ground terminal GND and the output capacitor Co2, respectively. In this case the flying capacitor Cf2 charges the output capacitor Co2 to generate the negative voltage Vn=−VB1/2.

Figure 24:
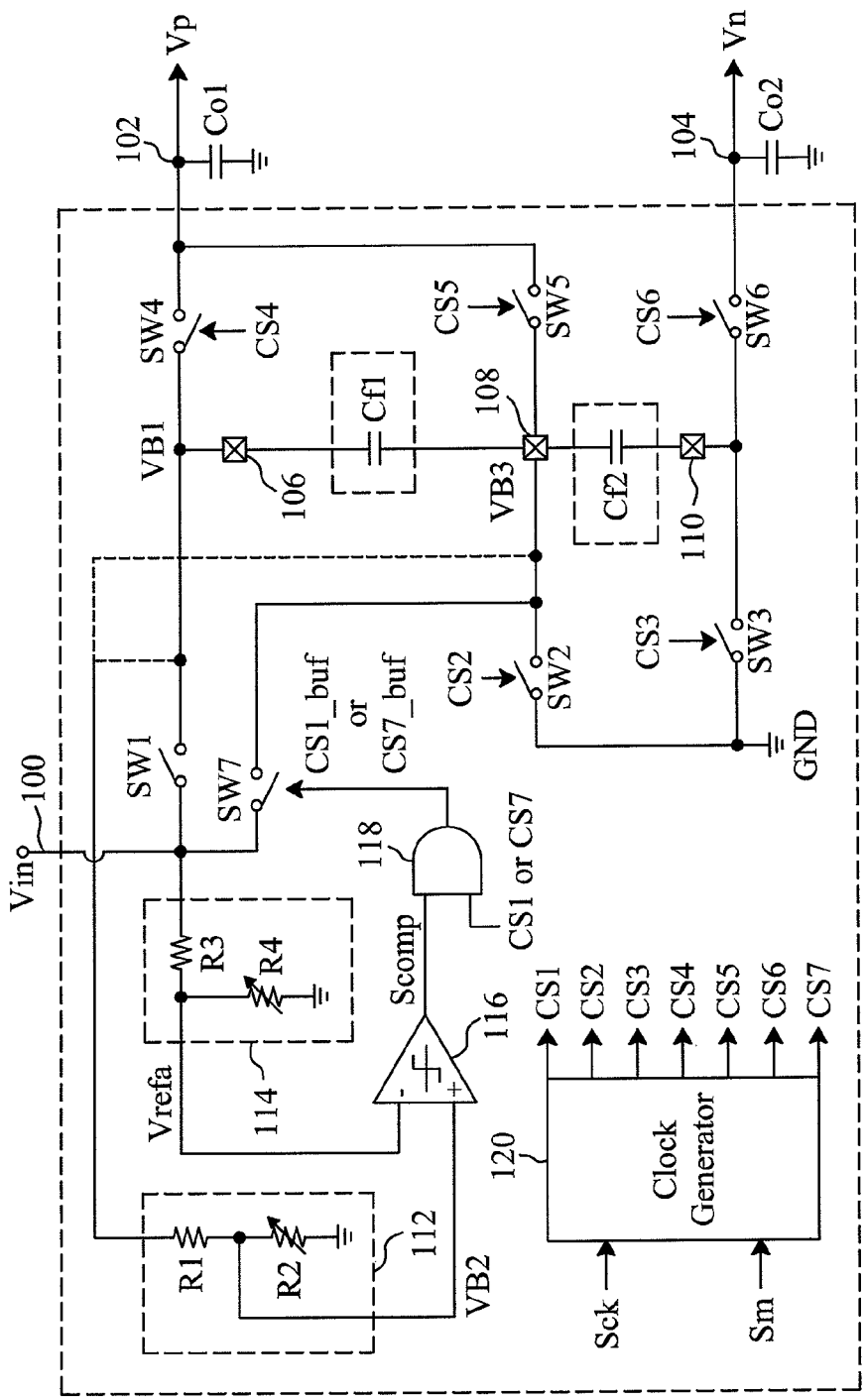
FIG. 24 is a circuit diagram of a third embodiment for the regulable charge pump shown in FIG. 5.

FIG. 24 is a third embodiment for the regulable charge pump 72 shown in FIG. 5. Similar to the circuit shown in FIG. 17, it also has the input terminal 100, output terminals 102 and 104, bonding pads 106, 108 and 110, detector 112, reference voltage generator 114, comparator 116, AND gate 118, clock generator 120 and switches SW1-SW7; however, the switch SW7 is connected between the input terminal 100 and the bonding pad 108. In the embodiment shown in FIG. 24, the clock generator 120 determines the signals CS1, CS2, CS3, CS4, CS5, CS6 and CS7 according to the clock signal Sck and the mode select signal Sm, and the signals CS2, CS3, CS4, CS5 and CS6 control the switches SW2, SW3, SW4, SW5 and SW6, respectively. When the regulable charge pump 72 operates in its first mode, the switch SW1 is controlled by the signal CS1, and the AND gate 118 generates the signal CS7_buf according to the comparison signal Scomp and the signal CS7 to control the switch SW7. At this time the detector 112 detects the voltage VB3 of the bonding pad 108 to generate the voltage VB2. When the voltage VB2 becomes greater than the reference voltage Vrefa, meaning that the voltage VB3 reaches a target value, the comparator 116 turns off the comparison signal Scomp to turn off the switch SW7. When the regulable charge pump 72 operates in its second mode, the switch SW7 is controlled by the signal CS7, and the AND gate 118 generates the signal CS1_buf according to the comparison signal Scomp and the signal CS1 to control the switch SW1. At this time the detector 112 detects the voltage VB1 of the bonding pad 106 to generate the voltage VB2. When the voltage VB2 becomes greater than the reference voltage Vrefa, meaning that the voltage VB1 reaches a target value, the comparator 116 turns off the comparison signal Scomp to turn off the switch SW1. The regulable charge pump 72 shown in FIG. 24 has only seven switches and needs only three bonding pads for connection with two flying capacitors Cf1 and Cf2. In comparison with the charge pump 22 shown in FIG. 3, the regulable charge pump 72 shown in FIG. 24 saves one switch and one bonding pad, thereby saving costs and die area of an integrated circuit.

Figure 25:
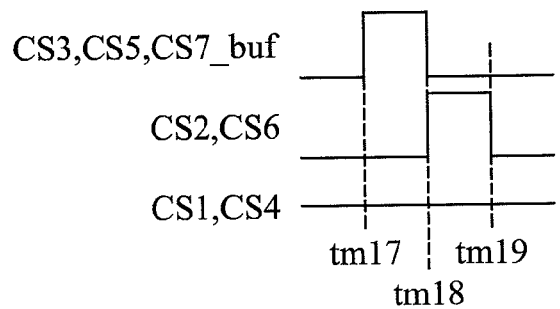
FIG. 25 is a timing diagram of the regulable charge pump shown in FIG. 24 in its first mode.
Figure 26:
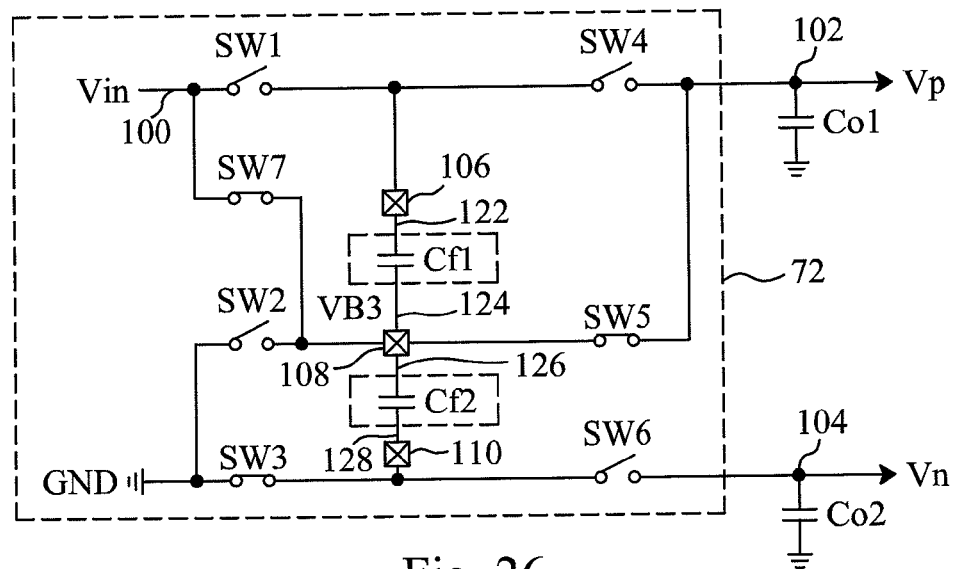
FIG. 26 is a circuit diagram of the regulable charge pump shown in FIG. 24 in its first operation state of its first mode.

FIG. 25 is a timing diagram of the regulable charge pump 72 shown in FIG. 24 in its first mode. When the regulable charge pump 72 is in the first operation state of the first mode, as during the period between time tm17 and time tm18, the signals CS3, CS5 and CS7_buf turn on the switches SW3, SW5 and SW7, and the signals CS1, CS2, CS4 and CS6 turn off the switches SW1, SW2, SW4 and SW6. As shown in FIG. 26, the first terminal 122 of the flying capacitor Cf1 is floating. The first terminal 126 of the flying capacitor Cf2 is connected to the input terminal 100 and the output capacitor Co1, and the second terminal 128 of the flying capacitor Cf2 is connected to the ground terminal GND. In this case the first terminal 122 of the flying capacitor Cf1 is floating, so the flying capacitor Cf1 is disabled to stop working, and the input voltage Vin charges the flying capacitor Cf2 and the output capacitor Co1, thereby generating the positive voltage Vp=VB3. The detector 112 detects the voltage VB3 to generate the voltage VB2. When the voltage VB3 (or the positive voltage Vp) reaches a target value, i.e. VB2=Vrefa, the regulable charge pump 72 enters the second operation state of the first mode.

Figure 27:
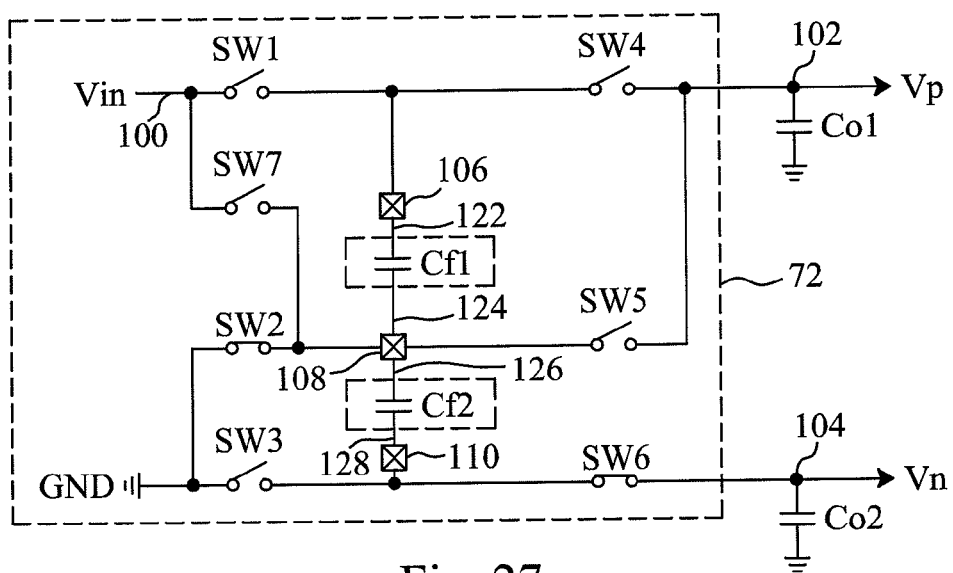
FIG. 27 is a circuit diagram of the regulable charge pump shown in FIG. 24 in its second operation state of its first mode.

When the regulable charge pump 72 is in the second operation state of the first mode, as during the period between time tm18 and time tm19, the signals CS1, CS3, CS4, CS5 and CS7_buf turn off the switches SW1, SW3, SW4, SW5 and SW7, and the signals CS2 and CS6 turn on the switches SW2 and SW6. As shown in FIG. 27, the first terminal 122 of the flying capacitor Cf1 is floating, and the first terminal 126 and the second terminal 128 of the flying capacitor Cf2 are connected to the ground terminal GND and the output capacitor Co2, respectively. In this case the first terminal 122 of the flying capacitor Cf1 is floating, so the flying capacitor Cf1 is disabled to stop working, and the flying capacitor Cf2 charges the output capacitor Co2, thereby generating negative voltage Vn=−VB3.

Figure 28:
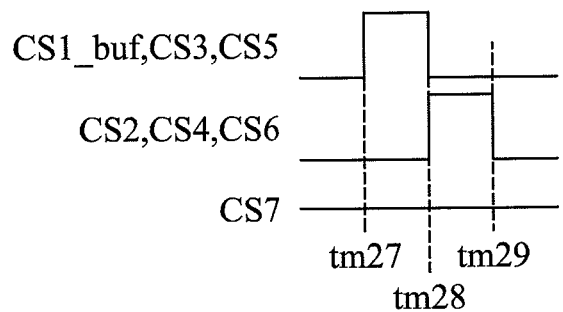
FIG. 28 is a timing diagram of the regulable charge pump shown in FIG. 24 in its second mode.
Figure 29:
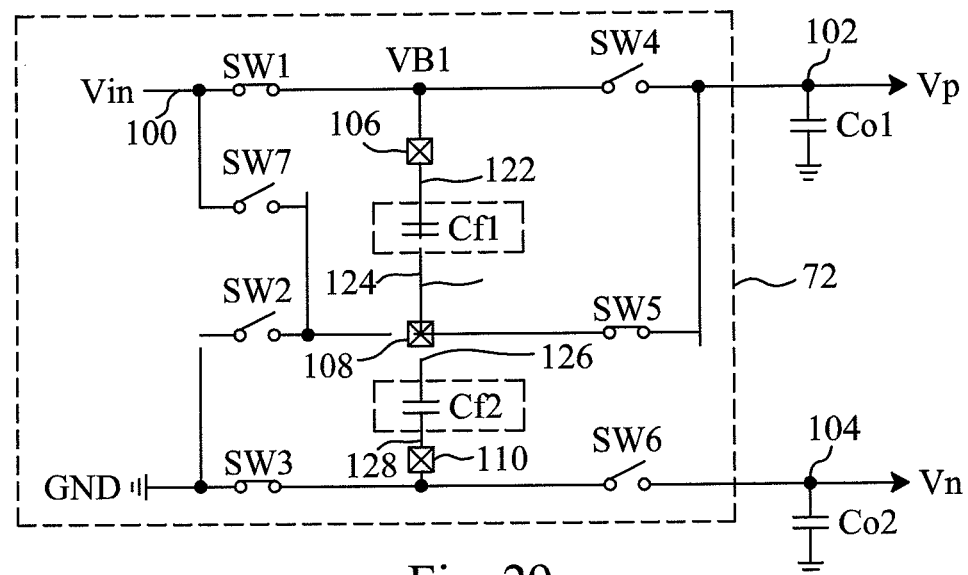
FIG. 29 is a circuit diagram of the regulable charge pump shown in FIG. 24 in its first operation state of its second mode.

FIG. 28 is a timing diagram of the regulable charge pump 72 shown in FIG. 24 in the second mode. When the regulable charge pump 72 is in the first operation state of the second mode, as during the period between time tm27 and time tm28, the signals CS1_buf, CS3 and CS5 turn on the switches SW1, SW3 and SW5, and the signals CS2, CS4, CS6 and CS7 turn off the switches SW2, SW4, SW6 and SW7. As shown in FIG. 29, the first terminal 122 of the flying capacitor Cf1 is connected to the input terminal 100, the second terminal 124 of the flying capacitor Cf1 is connected to the output capacitor Co1 and the first terminal 126 of the flying capacitor Cf2, and the second terminal 128 of the flying capacitor Cf2 is connected to the ground terminal GND. In this case the input voltage Vin charges the flying capacitors Cf1 and Cf2 and the output capacitor Co1 to generate the voltage VB1 and the positive voltage Vp. Assuming that, in this embodiment, Cf1=Cf2+Co1, the flying capacitors Cf1 and Cf2 and the output capacitor Co1 will divide the voltage VB1 to generate the positive voltage Vp=VB1/2. The detector 112 detects the voltage VB1 to generate the voltage VB2. When the voltage VB1 reaches a target value, i.e. VB2=Vrefa, the regulable charge pump 72 enters the second operation state of the second mode.

Figure 30:
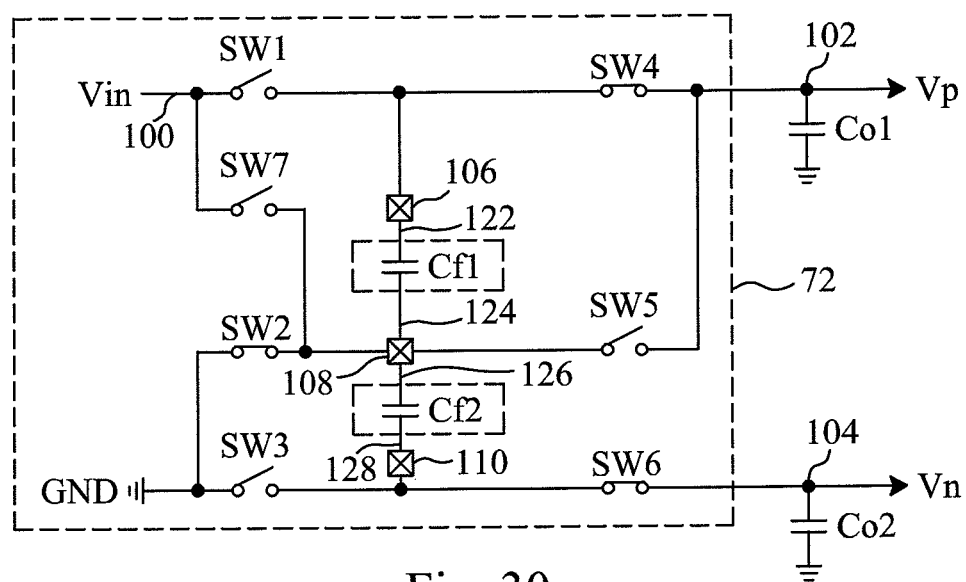
FIG. 30 is a circuit diagram of the regulable charge pump shown in FIG. 24 in its second operation state of its second mode.

When the regulable charge pump 72 is in its second operation state of its second mode, as during the period between time tm28 and time tm29, the signals CS1_buf, CS3, CS5 and CS7 turn off the switches SW1, SW3, SW5 and SW7, and the signals CS2, CS4 and CS6 turn on the switches SW2, SW4 and SW6. As shown in FIG. 30, the first terminal 122 and the second terminal 124 of the flying capacitor Cf1 are connected to the output capacitor Co1 and the ground terminal GND, respectively, and the first terminal 126 and the second terminal 128 of the flying capacitor Cf2 are connected to the ground terminal GND and the output capacitor Co2. In this case the flying capacitor Cf2 charges the output capacitor Co2 to generate the negative voltage Vn=−VB1/2.

As shown in FIGS. 11, 14, 18, 21, 25 and 28, the regulable charge pump 72 shown in FIG. 10, 17 or 24 uses fewer switches and bonding pads, and only needs two phase control for generating the positive voltage Vp and the negative voltage Vn, thereby simplifying the operation.

Figure 31:
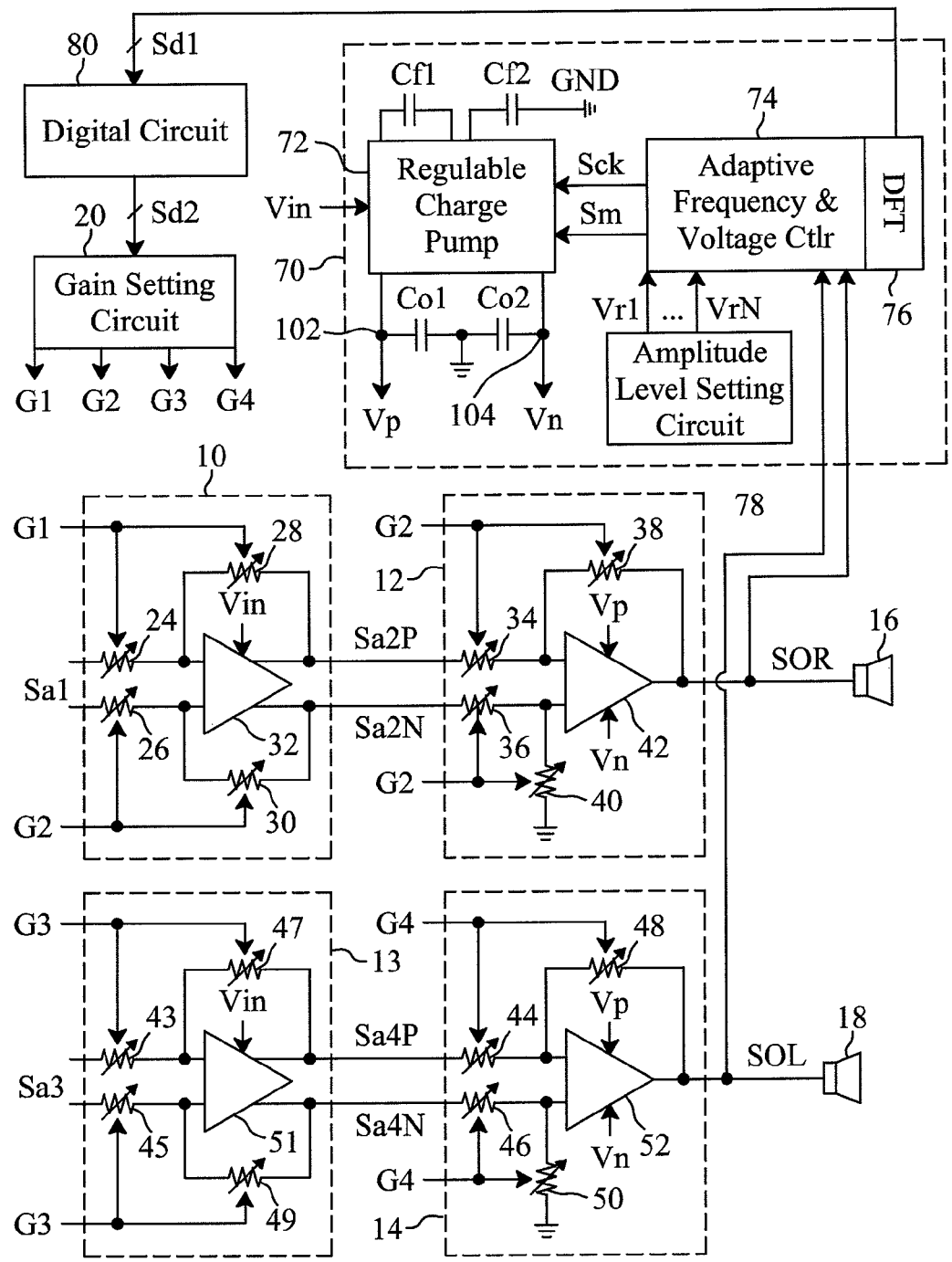
FIG. 31 is a circuit diagram of an audio output apparatus using a control circuit according to a third embodiment of the present invention.

FIG. 31 is a third embodiment for the control circuit 70 according to the present invention. Similar to the circuit shown in FIG. 5, the control circuit 70 in this embodiment also includes the regulable charge pump 72, adaptive frequency and voltage controller 74, amplitude level setting circuit 78, flying capacitors Cf1 and Cf2 and output capacitors Co1 and Cot, while the first terminal of the flying capacitor Cf2 is not connected to the second terminal of the flying capacitor Cf1, and the second terminal of the flying capacitor Cf2 is connected to the ground terminal GND. The adaptive frequency and voltage controller 74 shown in FIG. 31 may be similar to its counterpart shown in FIG. 8, in determining the clock signal Sck and the mode select signal Sm by detecting the signals Sa2P, Sa2N, Sa4P and Sa4N that are related to the output signals SOR and SOL.

Figure 32:
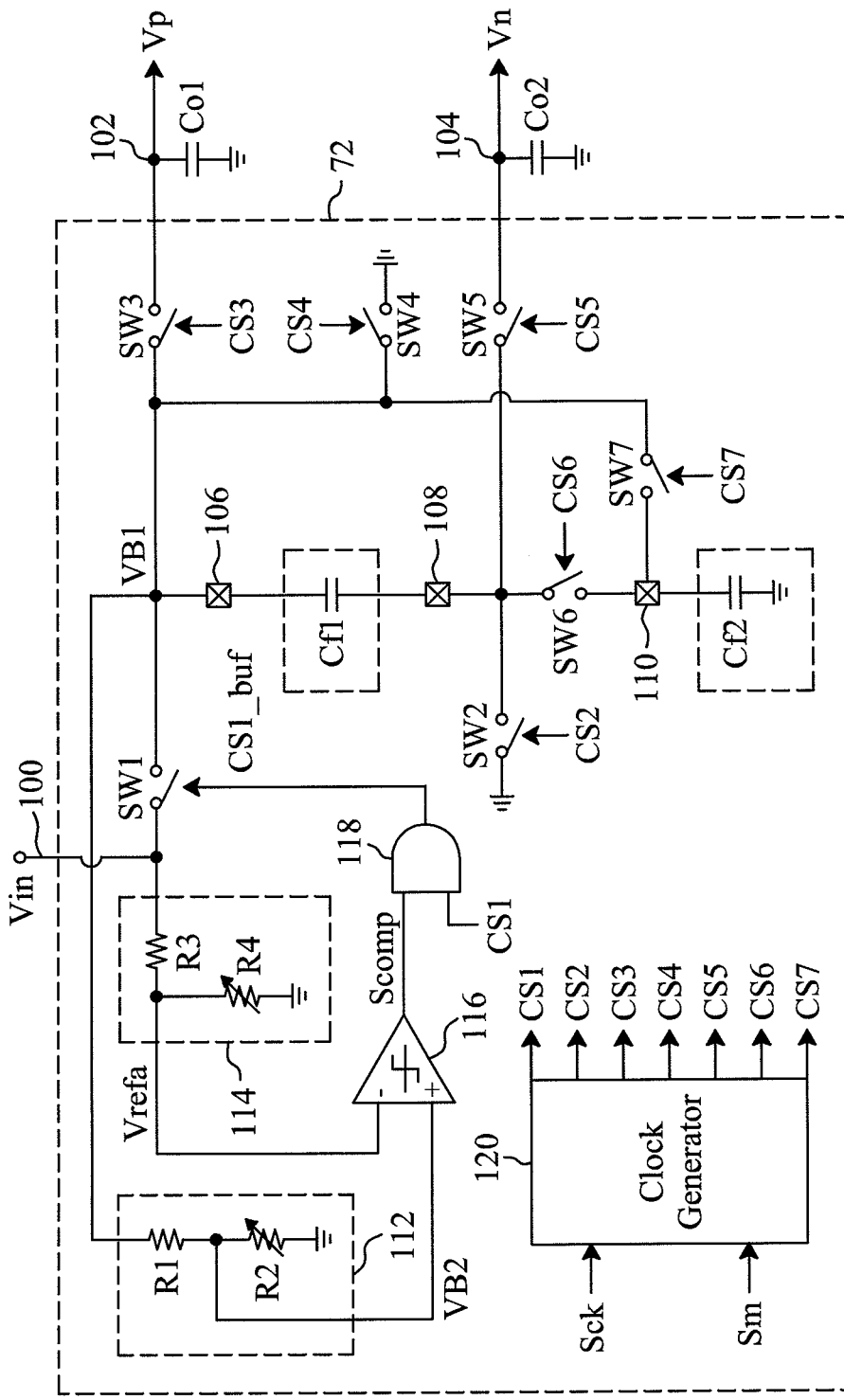
FIG. 32 is a circuit diagram of an embodiment for the regulable charge pump shown in FIG. 31.

FIG. 32 shows an embodiment for the regulable charge pump 72 shown in FIG. 31. Similar to the circuit shown in FIG. 10, the regulable charge pump 72 in this embodiment also includes the input terminal 100, output terminals 102 and 104, bonding pads 106, 108 and 110, detector 112, reference voltage generator 114, comparator 116, AND gate 118 and clock generator 120, while the bonding pad 108 is not connected to the flying capacitor Cf2, and the clock generator 120 is configured to generate the signals CS1, CS2, CS3, CS4, CS5, CS6 and CS7 according to the clock signal Sck and the mode select signal Sm. The regulable charge pump 72 shown in FIG. 32 further includes a switch SW1 connected between the input terminal 100 and the bonding pad 106 and controlled by the signal CS1_buf, a switch SW2 connected between the bonding pad 108 and the ground terminal GND and controlled by the signal CS2, a switch SW3 connected between the bonding pad 106 and the output terminal 102 and controlled by the signal CS3, a switch SW4 connected between the bonding pad 106 and the ground terminal GND and controlled by the signal CS4, a switch SW5 connected between the bonding pad 108 and the output terminal 104 and controlled by the signal CS5, a switch SW6 connected between the bonding pads 108 and 110 and controlled by the signal CS6, and a switch SW7 connected between the bonding pads 106 and 110 and controlled by the signal CS7. The regulable charge pump 72 shown in FIG. 32 has only seven switches and needs only three bonding pads for connection with two flying capacitors Cf1 and Cf2. In comparison with the charge pump 22 shown in FIG. 3, the regulable charge pump 72 shown in FIG. 32 saves one switch and one bonding pad, thereby saving costs and die area of an integrated circuit.

Figure 33:
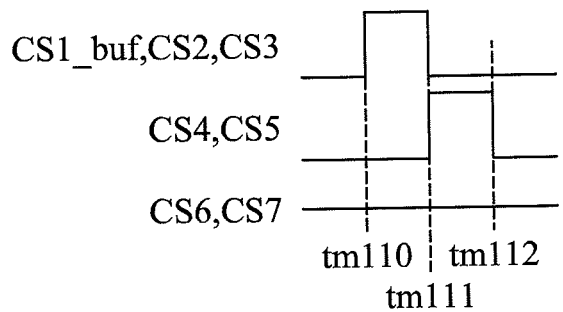
FIG. 33 is a timing diagram of the regulable charge pump shown in FIG. 32 in its first mode.
Figure 34:
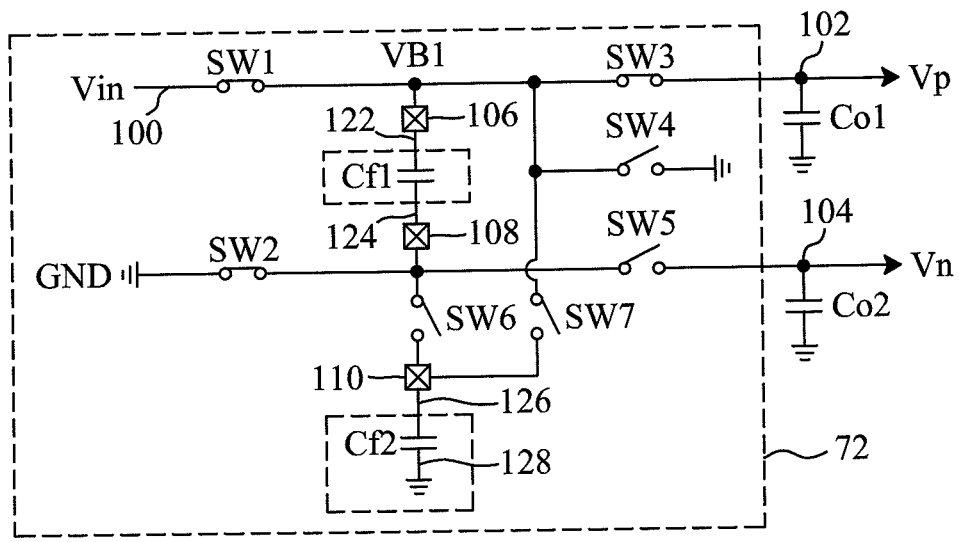
FIG. 34 is a circuit diagram of the regulable charge pump shown in FIG. 32 in its first operation state of its first mode.

FIG. 33 is a timing diagram of the regulable charge pump 72 shown in FIG. 32 in its first mode. When the regulable charge pump 72 is in its first operation state of its first mode, as during the period between time tm110 and time tm111, the signals CS1_buf, CS2 and CS3 turn on the switches SW1, SW2 and SW3, and the signals CS4, CS5, CS6 and CS7 turn off the switches SW4, SW5, SW6 and SW7. As shown in FIG. 34, the first terminal 122 of the flying capacitor Cf1 is connected to the input terminal 100 and the output capacitor Co1, the second terminal 124 of the flying capacitor Cf1 is connected to the ground terminal GND, and the first terminal 126 of the flying capacitor Cf2 whose second terminal 128 is grounded is floating. In this case the first terminal 126 of the flying capacitor Cf2 is floating, so the flying capacitor Cf2 is disabled to stop working, and the input voltage Vin charges the flying capacitor Cf1 and the output capacitor Co1 to generate the positive voltage Vp=VB1. When the voltage VB1 (or the positive voltage Vp) reaches a target value, i.e. VB2=Vrefa, the regulable charge pump 72 enters its second operation state of its first mode.

Figure 35:
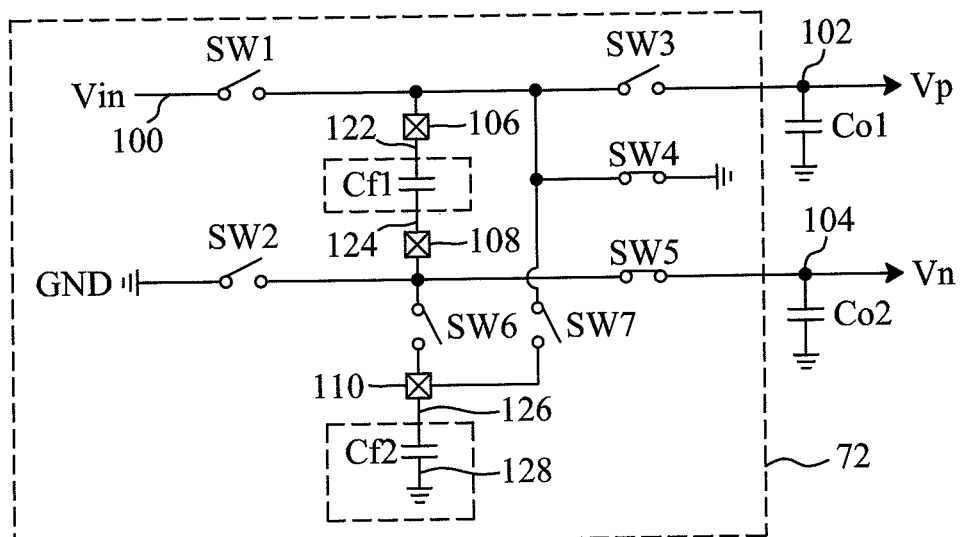
FIG. 35 is a circuit diagram of the regulable charge pump shown in FIG. 32 in its second operation state of its first mode.

When the regulable charge pump 72 is in its second operation state of its first mode, as during the period between time tm111 and time tm112, the signals CS1_buf, CS2, CS3, CS6 and CS7 turn off the switches SW1, SW2, SW3, SW6 and SW7, and the signals CS4 and CS5 turn on the switches SW4 and SW5. As shown in FIG. 35, the first terminal 122 and the second terminal 124 of the flying capacitor Cf1 are connected to the ground terminal GND and the output capacitor Co2, respectively, and the first terminal 126 of the flying capacitor Cf2 is floating. In this case the first terminal 126 of the flying capacitor Cf2 is floating, so the flying capacitor Cf2 is disabled to stop working, and the flying capacitor Cf1 charges the output capacitor Co2 to generate the negative voltage Vn=−VB1.

Figure 36:
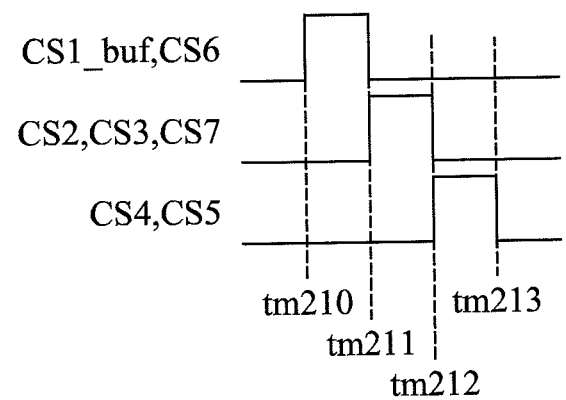
FIG. 36 is a timing diagram of the regulable charge pump shown in FIG. 32 in its second mode.
Figure 37:
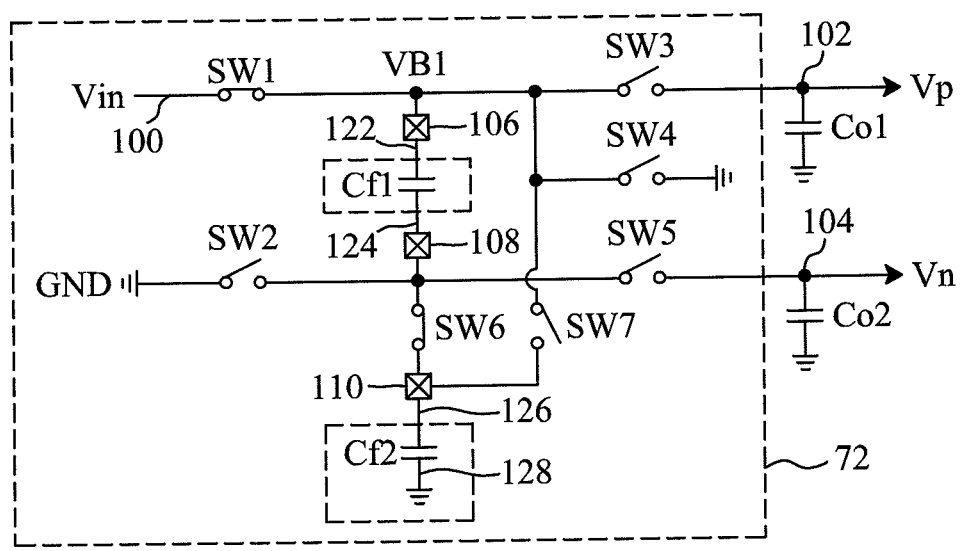
FIG. 37 is a circuit diagram of the regulable charge pump shown in FIG. 32 in its first operation state of its second mode.

FIG. 36 is a timing diagram of the regulable charge pump 72 shown in FIG. 32 in its second mode. When the regulable charge pump 72 in its first operation state of its second mode, as during the period between time tm210 and time tm211, the signals CS1_buf and CS6 turn on the switches SW1 and SW6, and the signals CS2, CS3, CS4, CS5 and CS7 turn off the switches SW2, SW3, SW4, SW5 and SW7. As shown in FIG. 37, the first terminal 122 and second terminal 124 of the flying capacitor Cf1 are connected to the input terminal 100 and the first terminal 126 of the flying capacitor Cf2, respectively. In this case the input voltage Vin charges the flying capacitors Cf1 and Cf2 to generate the voltage VB1. Assuming that in the embodiment Cf1=Cf2, the across voltage of each of the flying capacitors Cf1 and Cf2 will be VB1/2. When the voltage VB1 reaches a target value, i.e. VB2=Vrefa, the regulable charge pump 72 enters its second operation state of its second mode.

Figure 38:
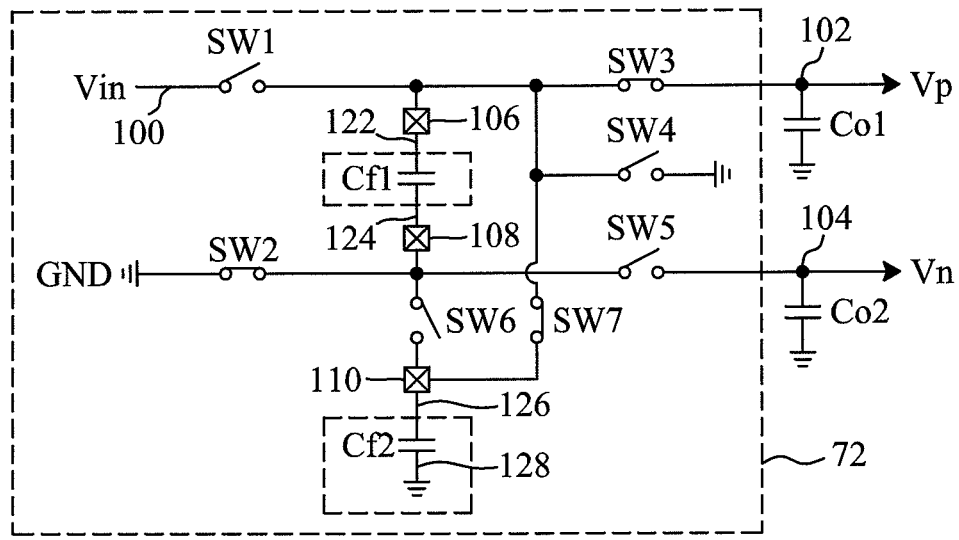
FIG. 38 is a circuit diagram of the regulable charge pump shown in FIG. 32 in its second operation state of its second mode.

When the regulable charge pump 72 is in its second operation state of its second mode, as during the period between time tm211 and time tm212, the signals CS1_buf, CS4, CS5 and CS6 turn off the switches SW1, SW4, SW5 and SW6 and the signals CS2, CS3 and CS7 turn on the switches SW2, SW3 and SW7. As shown in FIG. 38, the first terminal 122 and second terminal 124 of the flying capacitor Cf1 are connected to the output capacitor Co1 and the ground terminal GND, respectively, and the first terminal 126 of the flying capacitor Cf2 is connected to the output capacitor Co1. In this case the flying capacitors Cf1 and Cf2 charge the output capacitor Co1 to generate the positive voltage Vp=VB1/2.

Figure 39:
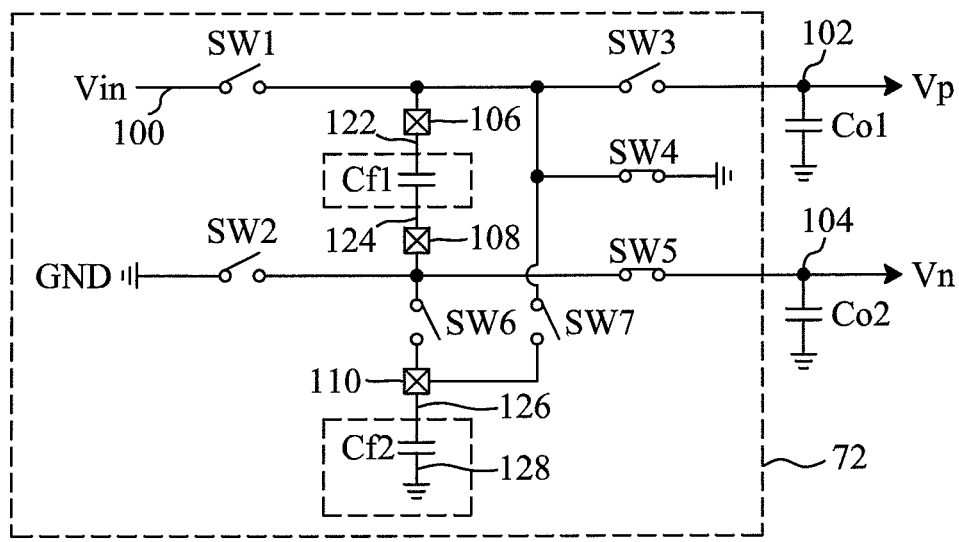
FIG. 39 is a circuit diagram of the regulable charge pump shown in FIG. 32 in its third operation state of its second mode.

When the regulable charge pump 72 is in its third operation state of its second mode, as during the period between time tm212 and time tm213, the signals CS1_buf, CS2, CS3, CS6 and CS7 turn off the switches SW1, SW2, SW3, SW6 and SW7, and the signals CS4 and CS5 turn on the switches SW4 and SW5. As shown in FIG. 39, the first terminal 122 and second terminal 124 of the flying capacitor Cf1 are connected to the ground terminal GND and the output capacitor Co2, respectively, and the first terminal 126 of the flying capacitor Cf2 is floating. In this case the first terminal 126 of the flying capacitor Cf2 is floating, so the flying capacitor Cf2 is disabled to stop working, and the flying capacitor Cf1 charges the output capacitor Co2 to generate the negative voltage Vn=−VB1/2.

In applications where free adjustment of either Vp or Vn is not required, the detector 112, reference voltage generator 114, comparator 116 and AND gate 118 shown in FIGS. 10, 17, 24 and 32 can be removed for saving costs and die area of an integrated circuit.

Figure 40:
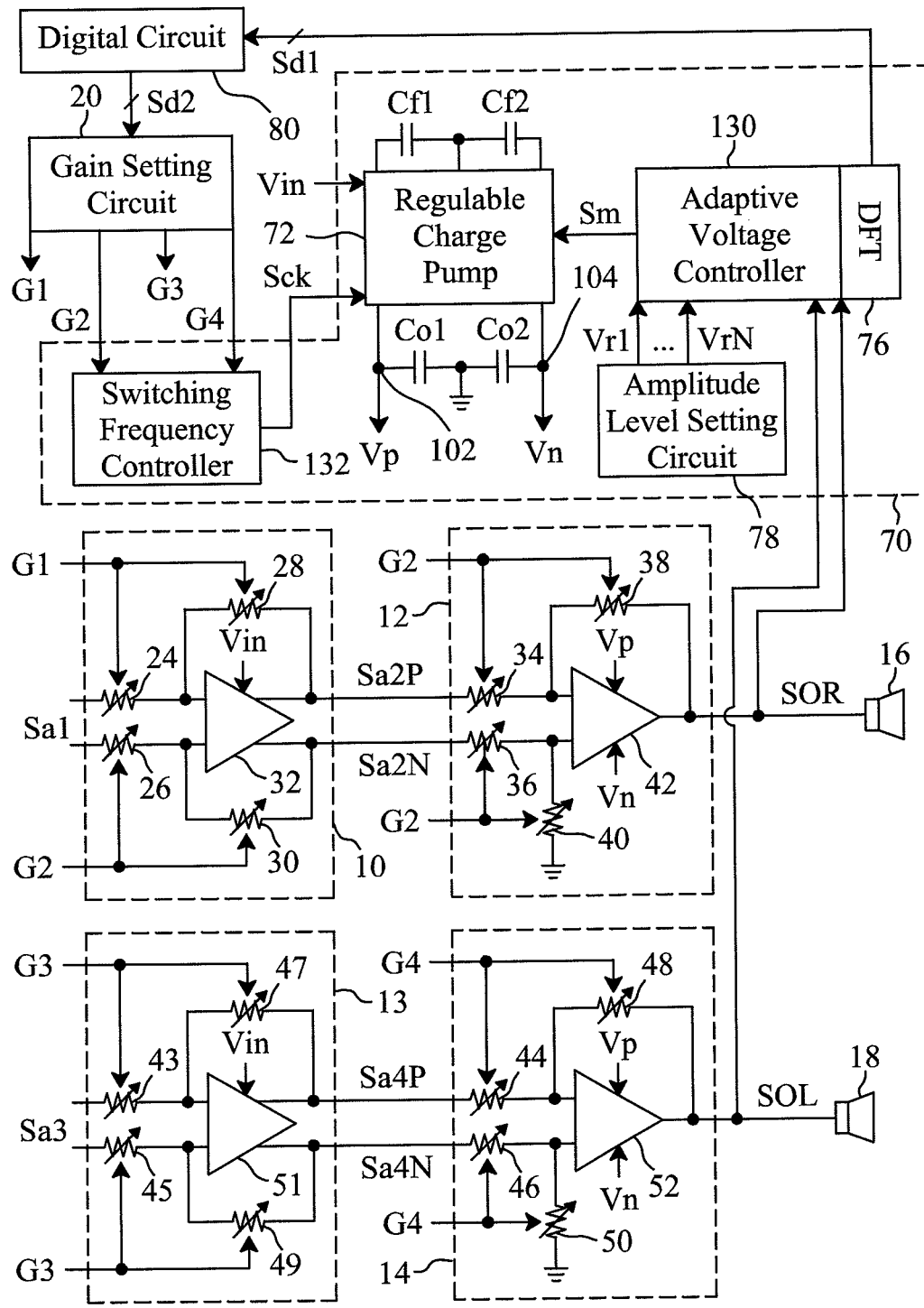
FIG. 40 is a circuit diagram of an audio output apparatus using a control circuit according to a fourth embodiment of the present invention.

FIG. 40 is a fourth embodiment for the control circuit 70 according to the present invention. In addition to the regulable charge pump 72, amplitude level setting circuit 78, flying capacitors Cf1 and Cf2 and output capacitors Co1 and Co2 as shown in FIG. 5, the control circuit 70 in this embodiment includes an adaptive voltage controller 130 and a switching frequency controller 132. The adaptive voltage controller 130 detects the output signals SOR and SOL, and compares the output signals SOR and SOL with the reference voltages Vr1-VrN to identify the levels of the output signals SOR and SOL and in turn to determine the mode select signal Sm. The adaptive voltage controller 130 includes a DFT circuit 76 to identify whether the magnitude of the output signals SOR and SOL is correct. The switching frequency controller 132 determines the clock signal Sck according to the setting signals G2 and G4 provided by the gain setting circuit 20. The regulable charge pump 72 switches the operation mode according to the mode select signal Sm, and operates at the switching frequency determined by the clock signal Sck. The adaptive voltage controller 130 shown in FIG. 40 may be similar to the adaptive frequency and voltage controller 74 shown in FIG. 8, in determining the mode select signal Sm by detecting the signals Sa2P, Sa2N, Sa4P and Sa4N of the input terminals of the power stages 12 and 14. The regulable charge pump 72 shown in FIG. 40 may have the circuit as shown in FIG. 10, 17 or 24.

Figure 41:
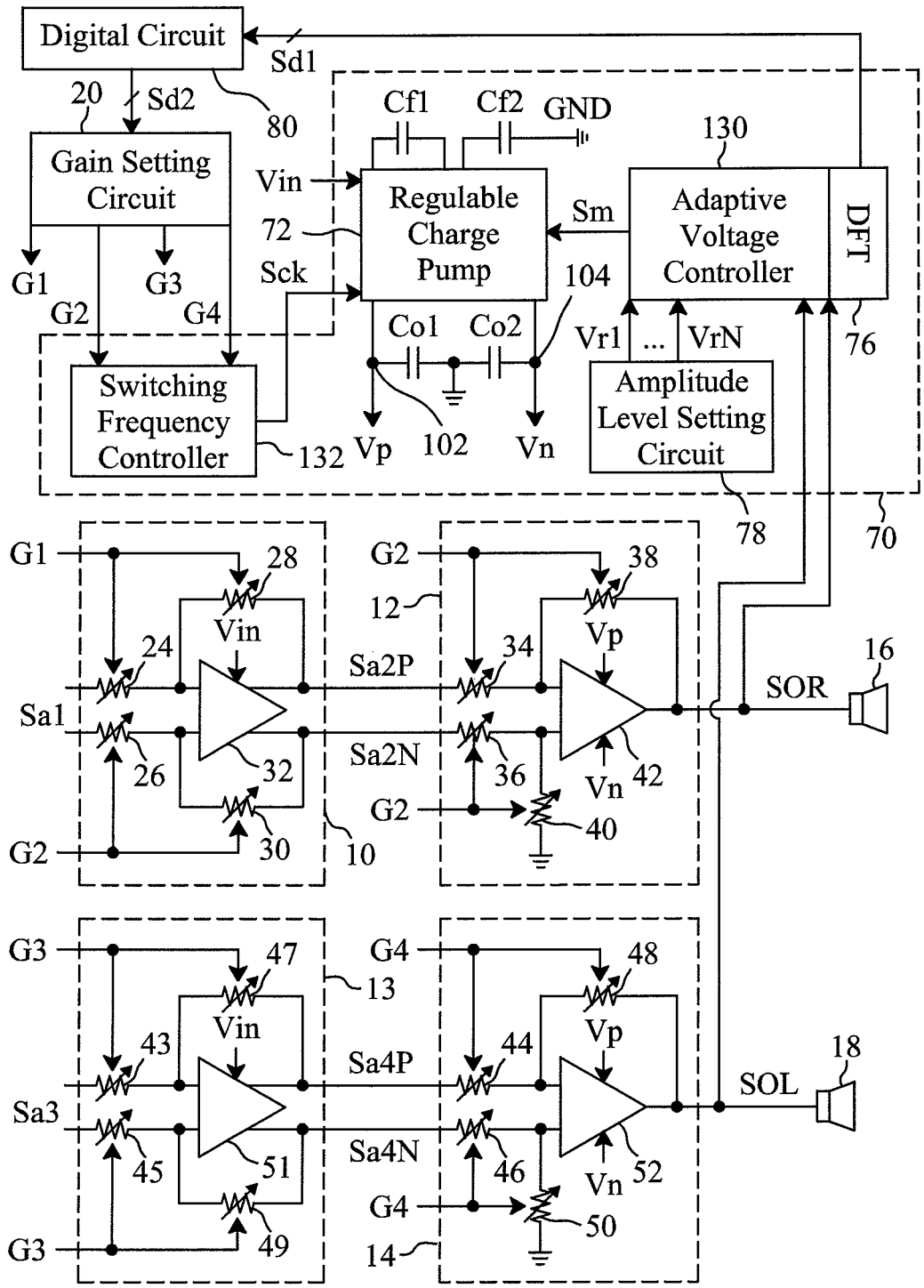
FIG. 41 is a circuit diagram of an audio output apparatus using a control circuit according to a fifth embodiment of the present invention.

The adaptive frequency and voltage controller 74 shown in FIG. 31 may be replaced by the adaptive voltage controller 130 and the switching frequency controller 132 shown in FIG. 40, to control the operation mode and the switching frequency of the regulable charge pump 72, as shown in FIG. 41. The adaptive voltage controller 130 shown in FIG. 41 may be similar to the adaptive frequency and voltage controller 74 shown in FIG. 8, in determining the mode select signal Sm by detecting the signals Sa2P, Sa2N, Sa4P and Sa4N of the input terminals of the power stages 12 and 14. The regulable charge pump 72 of FIG. 41 may be the same as that shown in FIG. 32.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:
1. A charge pump comprising:
a first bonding pad and a second bonding pad for a first flying capacitor connected therebetween;
a third bonding pad and the second bonding pad for a second flying capacitor connected therebetween;
an input terminal configured to operably receive an input voltage;
a first output terminal connected to a first output capacitor, configured to operably provide a positive voltage;

a second output terminal connected to a second output capacitor, configured to operably provide a negative voltage;

a first switch connected between the input terminal and the first bonding pad;

a second switch connected between the second bonding pad and a ground terminal;

a third switch connected between the third bonding pad and the ground terminal;

a fourth switch connected between the first bonding pad and the first output terminal;

a fifth switch connected between the second bonding pad and the first output terminal;

a sixth switch connected between the third bonding pad and the second output terminal;

a clock generator connected to the first switch, the second switch, the third switch, the fourth switch, the fifth switch and the sixth switch, configured to operably generate first signal, second signal, third signal, fourth signal, fifth signal and sixth signal to control the first switch, the second switch, the third switch, the fourth switch, the fifth switch and the sixth switch, respectively;

a detector connected to the first bonding pad, configured to operably detect a first voltage of the first bonding pad to generate a second voltage related to the first voltage;

a reference voltage generator configured to operably provide a variable reference voltage for controlling the positive voltage or the negative voltage; and a comparator connected to the detector and the reference voltage generator, configured to operably compare the second voltage with the reference voltage to turn off the first switch when the second voltage becomes greater than the reference voltage.

2. The charge pump of claim 1, wherein during a first operation state of a first mode of the charge pump, the first, third, fourth and fifth switches are turned on and the second and sixth switches are turned off; during a second operation state of the first mode of the charge pump, the first, third, fourth and fifth switches are turned off and the second and sixth switches are turned on; during a first operation state of a second mode of the charge pump, the first, third and fifth switches are turned on and the second, fourth and sixth switches are turn off; during a second operation state of the second mode of the charge pump, the first, third and fifth switches are turned off and the second, fourth and sixth switches are turned on.

3. The charge pump of claim 1, further comprising a seventh switch connected between the first bonding pad and the ground terminal, controlled by a seventh signal provided by the clock generator.

4. The charge pump of claim 3, wherein during a first operation state of a first mode of the charge pump, the first, third and fourth switches are turned on and the second, fifth, sixth and seventh switches are turned off; during a second operation state of the first mode of the charge pump, the first, second, third, fourth and fifth switches are turned off and the sixth and seventh switches are turned on; during a first operation state of a second mode of the charge pump, the first, third and fifth switches are turned on and the second, fourth, sixth and seventh switches are turned off; and during a second operation state of the second mode of the charge pump, the first, third, fifth and seventh switches are turned off and the second, fourth and sixth switches are turn on.

5. A charge pump comprising:

a first bonding pad and a second bonding pad for a first flying capacitor connected therebetween;

a third bonding pad and the second bonding pad for a second flying capacitor connected therebetween;

an input terminal configured to operably receive an input voltage;

a first output terminal connected to a first output capacitor, configured to operably provide a positive voltage;

a second output terminal connected to a second output capacitor, configured to operably provide a negative voltage;

a first switch connected between the input terminal and the first bonding pad;

a second switch connected between the second bonding pad and a ground terminal;

a third switch connected between the third bonding pad and the ground terminal;

a fourth switch connected between the first bonding pad and the first output terminal;

a fifth switch connected between the second bonding pad and the first output terminal;

a sixth switch connected between the third bonding pad and the second output terminal; and a clock generator connected to the first switch, the second switch, the third switch, the fourth switch, the fifth switch and the sixth switch, configured to operably generate first signal, second signal, third signal, fourth signal, fifth signal and sixth signal to control the first switch, the second switch, the third switch, the fourth switch, the fifth switch and the sixth switch, respectively;

wherein during a first operation state of a first mode of the charge pump, the first, third, fourth and fifth switches are turned on and the second and sixth switches are turned off; during a second operation state of the first mode of the charge pump, the first, third, fourth and fifth switches are turned off and the second and sixth switches are turned on; during a first operation state of a second mode of the charge pump, the first, third and fifth switches are turned on and the second, fourth and sixth switches are turn off; during a second operation state of the second mode of the charge pump, the first, third and fifth switches are turned off and the second, fourth and sixth switches are turned on.

6. A charge pump comprising:

a first bonding pad and a second bonding pad for a first flying capacitor connected therebetween;

a third bonding pad and the second bonding pad for a second flying capacitor connected therebetween;

an input terminal configured to operably receive an input voltage;

a first output terminal connected to a first output capacitor, configured to operably provide a positive voltage;

a second output terminal connected to a second output capacitor, configured to operably provide a negative voltage;

a first switch connected between the input terminal and the first bonding pad;

a second switch connected between the second bonding pad and a ground terminal;

a third switch connected between the third bonding pad and the ground terminal;

a fourth switch connected between the first bonding pad and the first output terminal;

a fifth switch connected between the second bonding pad and the first output terminal;

a sixth switch connected between the third bonding pad and the second output terminal;

a clock generator connected to the first switch, the second switch, the third switch, the fourth switch, the fifth switch and the sixth switch, configured to operably generate first signal, second signal, third signal, fourth signal, fifth signal and sixth signal to control the first switch, the second switch, the third switch, the fourth switch, the fifth switch and the sixth switch, respectively; and a seventh switch connected between the first bonding pad and the ground terminal, controlled by a seventh signal provided by the clock generator;

wherein during a first operation state of a first mode of the charge pump, the first, third and fourth switches are turned on and the second, fifth, sixth and seventh switches are turned off; during a second operation state of the first mode of the charge pump, the first, second, third, fourth and fifth switches are turned off and the sixth and seventh switches are turned on; during a first operation state of a second mode of the charge pump, the first, third and fifth switches are turned on and the second, fourth, sixth and seventh switches are turned off; and during a second operation state of the second mode of the charge pump, the first, third, fifth and seventh switches are turned off and the second, fourth and sixth switches are turn on.

7. A charge pump comprising:

a first bonding pad and a second bonding pad for a first flying capacitor connected therebetween;

a third bonding pad and the second bonding pad for a second flying capacitor connected therebetween;

an input terminal configured to operably receive an input voltage;

a first output terminal connected to a first output capacitor, configured to operably provide a positive voltage;

a second output terminal connected to a second output capacitor, configured to operably provide a negative voltage;

a first switch connected between the input terminal and the first bonding pad;

a second switch connected between the second bonding pad and a ground terminal;

a third switch connected between the third bonding pad and the ground terminal;

a fourth switch connected between the first bonding pad and the first output terminal;

a fifth switch connected between the second bonding pad and the first output terminal;

a sixth switch connected between the third bonding pad and the second output terminal;

a clock generator connected to the first switch, the second switch, the third switch, the fourth switch, the fifth switch and the sixth switch, configured to operably generate first signal, second signal, third signal, fourth signal, fifth signal and sixth signal to control the first switch, the second switch, the third switch, the fourth switch, the fifth switch and the sixth switch, respectively;

a seventh switch connected between the input terminal and the second bonding pad, controlled by a seventh signal determined by a clock signal and a mode select signal by the clock generator;

a detector connected to the first and second bonding pads, configured to operably detect a first voltage of the first bonding pad during a second mode of the charge pump to generate a second voltage, and detect a third voltage of the second bonding pad during a first mode of the charge pump to generate the second voltage;

a reference voltage generator configured to operably provide a variable reference voltage for controlling the positive voltage or the negative voltage; and a comparator connected to the detector and the reference voltage generator, configured to operably compare the second voltage with the reference voltage to turn off the seventh switch during the first mode of the charge pump when the second voltage becomes greater than the reference voltage, and to turn off the first switch during the second mode of the charge pump when the second voltage becomes greater than the reference voltage.

8. The charge pump of claim 7, wherein during a first operation state of the first mode of the charge pump, the first, second, fourth and sixth switches are turned off and the third, fifth and seventh switches are turned on; during a second operation state of the first mode of the charge pump, the first, third, fourth, fifth and seventh switches are turned off and the second and sixth switches are turned on; during a first operation state of the second mode of the charge pump, the first, third and fifth switches are turned on and the second, fourth, sixth and seventh switches are turned off; during a second operation state of the second mode of the charge pump, the first, third, fifth and seventh switches are turned off and the second, fourth and sixth switches are turn on.

9. A charge pump comprising:

a first bonding pad and a second bonding pad for a first flying capacitor connected therebetween;

a third bonding pad and the second bonding pad for a second flying capacitor connected therebetween;

an input terminal configured to operably receive an input voltage;

a first output terminal connected to a first output capacitor, configured to operably provide a positive voltage;

a second output terminal connected to a second output capacitor, configured to operably provide a negative voltage;

a first switch connected between the input terminal and the first bonding pad;

a second switch connected between the second bonding pad and a ground terminal;

a third switch connected between the third bonding pad and the ground terminal;

a fourth switch connected between the first bonding pad and the first output terminal;

a fifth switch connected between the second bonding pad and the first output terminal;

a sixth switch connected between the third bonding pad and the second output terminal;

a clock generator connected to the first switch, the second switch, the third switch, the fourth switch, the fifth switch and the sixth switch, configured to operably generate first signal, second signal, third signal, fourth signal, fifth signal and sixth signal to control the first switch, the second switch, the third switch, the fourth switch, the fifth switch and the sixth switch, respectively; and a seventh switch connected between the input terminal and the second bonding pad, controlled by a seventh signal determined by a clock signal and a mode select signal by the clock generator;

wherein during a first operation state of a first mode of the charge pump, the first, second, fourth and sixth switches are turned off and the third, fifth and seventh switches are turned on; during a second operation state of the first mode of the charge pump, the first, third, fourth, fifth and seventh switches are turned off and the second and sixth switches are turned on; during a first operation state of a second mode of the charge pump, the first, third and fifth switches are turned on and the second, fourth, sixth and seventh switches are turned off; and during a second operation state of the second mode of the charge pump, the first, third, fifth and seventh switches are turned off and the second, fourth and sixth switches are turn on.

10. A charge pump comprising:
a first bonding pad and a second bonding pad for a first flying capacitor connected therebetween;
a third bonding pad connected to a second flying capacitor;
an input terminal configured to operably receive an input voltage;
a first output terminal connected to a first output capacitor, configured to operably provide a positive voltage;
a second output terminal connected to a second output capacitor, configured to operably provide a negative voltage;
a first switch connected between the input terminal and the first bonding pad;
a second switch connected between the second bonding pad and a ground terminal;
a third switch connected between the first bonding pad and the first output terminal;
a fourth switch connected between the first bonding pad and the ground terminal;
a fifth switch connected between the second bonding pad and the second output terminal;
a sixth switch connected between the second bonding pad and the third bonding pad;
a seventh switch connected between the first bonding pad and the third bonding pad;
a clock generator connected to the first switch, the second switch, the third switch, the fourth switch, the fifth switch, the sixth switch and the seventh switch, configured to operably generate first signal, second signal, third signal, fourth signal, fifth signal, sixth signal and seventh signal according to a clock signal and a mode select signal to control the first switch, the second switch, the third switch, the fourth switch, the fifth switch, the sixth switch and the seventh switch, respectively;
a detector connected to the first bonding pad, configured to operably detect a first voltage of the first bonding pad to generate a second voltage related to the first voltage;
a reference voltage generator configured to operably provide a variable reference voltage for controlling the positive voltage or the negative voltage; and
a comparator connected to the detector and the reference voltage generator, configured to operably compare the second voltage with the reference voltage to turn off the first switch when the second voltage becomes greater than the reference voltage.

11. The charge pump of claim 10, wherein during a first operation state of a first mode of the charge pump, the first switch, the second switch and the third switch are turned on and the fourth switch, the fifth switch, the sixth switch and the seventh switch are turned off; during a second operation state of the first mode of the charge pump, the first, second, third, sixth and seventh switches are turned off and the fourth and fifth switches are turned on; during a first operation state of a second mode of the charge pump, the first and sixth switches are turned on and the second, third, fourth, fifth and seventh switches are turned off; during a second operation state of the second mode of the charge pump, the first, fourth, fifth and sixth switches are turned off and the second, third and seventh switches are turned on; and during a third operation state of the second mode of the charge pump, the first, second, third, sixth and seventh switches are turned off and the fourth and fifth switches are turned on.

12. A charge pump comprising:
a first bonding pad and a second bonding pad for a first flying capacitor connected therebetween;
a third bonding pad connected to a second flying capacitor;
an input terminal configured to operably receive an input voltage;
a first output terminal connected to a first output capacitor, configured to operably provide a positive voltage;
a second output terminal connected to a second output capacitor, configured to operably provide a negative voltage;
a first switch connected between the input terminal and the first bonding pad;
a second switch connected between the second bonding pad and a ground terminal;
a third switch connected between the first bonding pad and the first output terminal;
a fourth switch connected between the first bonding pad and the ground terminal;
a fifth switch connected between the second bonding pad and the second output terminal;
a sixth switch connected between the second bonding pad and the third bonding pad;
a seventh switch connected between the first bonding pad and the third bonding pad; and
a clock generator connected to the first switch, the second switch, the third switch, the fourth switch, the fifth switch, the sixth switch and the seventh switch, configured to operably generate first signal, second signal, third signal, fourth signal, fifth signal, sixth signal and seventh signal according to a clock signal and a mode select signal to control the first switch, the second switch, the third switch, the fourth switch, the fifth switch, the sixth switch and the seventh switch, respectively;
wherein during a first operation state of a first mode of the charge pump, the first switch, the second switch and the third switch are turned on and the fourth switch, the fifth switch, the sixth switch and the seventh switch are turned off; during a second operation state of the first mode of the charge pump, the first, second, third, sixth and seventh switches are turned off and the fourth and fifth switches are turned on; during a first operation state of a second mode of the charge pump, the first and sixth switches are turned on and the second, third, fourth, fifth and seventh switches are turned off; during a second operation state of the second mode of the charge pump, the first, fourth, fifth and sixth switches are turned off and the second, third and seventh switches are turned on; and during a third operation state of the second mode of the charge pump, the first, second, third, sixth and seventh switches are turned off and the fourth and fifth switches are turned on.

* * * * *